(12) United States Patent
Magill et al.

(10) Patent No.: US 7,666,502 B2
(45) Date of Patent: *Feb. 23, 2010

(54) MULTI-COMPONENT FIBERS HAVING ENHANCED REVERSIBLE THERMAL PROPERTIES

(75) Inventors: Monte C. Magill, Greeley, CO (US); Mark H. Hartmann, Superior, CO (US); Jeffrey S. Haggard, Cocoa, FL (US)

(73) Assignee: Outlast Technologies, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/562,718

(22) Filed: Nov. 22, 2006

(65) Prior Publication Data

US 2007/0165990 A1    Jul. 19, 2007

Related U.S. Application Data

(60) Division of application No. 11/078,657, filed on Mar. 11, 2005, now Pat. No. 7,160,612, which is a continuation-in-part of application No. 11/051,543, filed on Feb. 4, 2005, now abandoned, which is a continuation-in-part of application No. 10/052,232, filed on Jan. 15, 2002, now Pat. No. 6,855,422, and a continuation-in-part of application No. 09/960,591, filed on Sep. 21, 2001, now abandoned, which is a continuation-in-part of application No. 09/691,164, filed on Oct. 19, 2000, now abandoned.

(60) Provisional application No. 60/234,410, filed on Sep. 21, 2000.

(51) Int. Cl.
*B32B 27/02* (2006.01)
*D01F 8/00* (2006.01)
*D01F 8/04* (2006.01)

(52) U.S. Cl. ............... 428/373; 428/327; 428/370; 428/372; 428/374

(58) Field of Classification Search .............. 165/53, 165/10, 104.17; 252/70, 67; 264/141, 4.32, 264/157, 211, 331.13, 331.17, 4.33, 4.4; 399/328; 428/218, 221, 370, 373, 398, 402.2, 428/102, 11, 26, 304.4, 305.5, 313.5, 321.5, 428/372, 374, 376, 4, 402, 402.21, 402.24, 428/403, 407, 906.6, 913; 442/131, 246, 442/247, 74, 75, 85; 521/67, 71, 72; 523/207, 523/210, 223; 524/156, 166, 167, 236, 238, 524/395, 474, 475, 489, 490, 493

See application file for complete search history.

(56) References Cited

U.S. PATENT DOCUMENTS

| | | | |
|---|---|---|---|
| 4,003,426 A | * | 1/1977 | Best et al. ............ 165/53 |
| 4,003,526 A | | 1/1977 | Best et al. |
| 4,111,189 A | | 9/1978 | Dizon |
| 4,122,203 A | | 10/1978 | Stahl |
| 4,169,554 A | | 10/1979 | Camp |
| 4,178,727 A | | 12/1979 | Prusinski et al. |
| 4,213,448 A | | 7/1980 | Hebert |
| 4,219,072 A | | 8/1980 | Barlow, Sr. |
| 4,237,023 A | | 12/1980 | Johnson et al. |
| 4,258,696 A | | 3/1981 | Gopal |
| 4,259,401 A | | 3/1981 | Chahroudi et al. |
| 4,277,357 A | | 7/1981 | Boardman |
| 4,290,416 A | | 9/1981 | Maloney |
| 4,294,078 A | | 10/1981 | MacCracken |
| 4,332,690 A | | 6/1982 | Kimura et al. |
| 4,360,442 A | | 11/1982 | Reedt et al. |
| 4,403,644 A | | 9/1983 | Hebert |
| 4,403,645 A | | 9/1983 | MacCracken |
| 4,460,649 A | | 7/1984 | Park et al. |
| 4,462,390 A | | 7/1984 | Holdridge et al. |
| 4,498,459 A | | 2/1985 | Korin et al. |
| 4,504,402 A | * | 3/1985 | Chen et al. ............ 252/70 |
| 4,505,953 A | | 3/1985 | Chen et al. |
| 4,513,053 A | * | 4/1985 | Chen et al. ............ 428/221 |
| 4,532,917 A | | 8/1985 | Taff et al. |
| 4,572,864 A | | 2/1986 | Benson et al. |
| 4,585,572 A | | 4/1986 | Lane et al. |
| 4,587,279 A | | 5/1986 | Salyer et al. |
| 4,587,404 A | | 5/1986 | Smith |
| 4,615,381 A | | 10/1986 | Maloney |

| | | | | | | |
|---|---|---|---|---|---|---|
| 4,617,332 | A | 10/1986 | Salyer et al. | 5,851,338 | A | 12/1998 | Pushaw |
| 4,637,888 | A | 1/1987 | Lane et al. | 5,851,562 | A | 12/1998 | Haggard et al. |
| 4,690,769 | A | 9/1987 | Lane et al. | 5,855,999 | A | 1/1999 | McCormack |
| 4,702,853 | A | 10/1987 | Benson et al. | 5,884,006 | A | 3/1999 | Frohlich et al. |
| 4,708,812 | A | 11/1987 | Hatfield | 5,885,475 | A | 3/1999 | Salyer |
| 4,711,813 | A | 12/1987 | Salyer | 5,897,952 | A | 4/1999 | Vigo et al. |
| 4,727,930 | A | 3/1988 | Bruckner et al. | 5,899,088 | A | 5/1999 | Purdum |
| 4,746,479 | A | 5/1988 | Hanaki et al. | 5,911,923 | A | 6/1999 | Work et al. |
| 4,747,240 | A | 5/1988 | Voisinet et al. | 5,932,129 | A | 8/1999 | Hyatt |
| 4,756,958 | A | 7/1988 | Bryant et al. | 5,935,157 | A | 8/1999 | Harmon |
| 4,807,696 | A | 2/1989 | Colvin et al. | 5,955,188 | A | 9/1999 | Pushaw |
| 4,825,939 | A | 5/1989 | Salyer et al. | 5,976,400 | A | 11/1999 | Muffett et al. |
| 4,828,542 | A | 5/1989 | Hermann | 5,997,762 | A | 12/1999 | Haget et al. |
| 4,851,291 | A | 7/1989 | Vigo et al. | 5,999,699 | A | 12/1999 | Hyatt |
| 4,856,294 | A | 8/1989 | Scaringe et al. | 6,004,662 | A | 12/1999 | Buckley |
| 4,871,615 | A * | 10/1989 | Vigo et al. .................. 428/398 | 6,025,287 | A | 2/2000 | Hermann |
| 4,908,166 | A | 3/1990 | Salyer | 6,041,437 | A | 3/2000 | Barker et al. |
| 4,908,238 | A | 3/1990 | Vigo et al. | 6,047,106 | A | 4/2000 | Salyer |
| 4,924,935 | A | 5/1990 | Van Winckel | 6,048,810 | A | 4/2000 | Baychar |
| 4,964,402 | A | 10/1990 | Grim et al. | 6,077,597 | A * | 6/2000 | Pause ......................... 428/218 |
| 4,983,798 | A | 1/1991 | Eckler et al. | 6,079,404 | A | 6/2000 | Salyer |
| 4,988,543 | A | 1/1991 | Houle et al. | 6,099,555 | A | 8/2000 | Sabin |
| 5,007,478 | A | 4/1991 | Sengupta | 6,099,894 | A | 8/2000 | Holman |
| 5,008,133 | A | 4/1991 | Herbet et al. | 6,108,489 | A | 8/2000 | Frohlich et al. |
| 5,053,446 | A | 10/1991 | Saler | 6,109,338 | A | 8/2000 | Butzer |
| 5,085,790 | A | 2/1992 | Hormansdorfer | 6,116,330 | A | 9/2000 | Salyer |
| 5,106,520 | A | 4/1992 | Salyer | 6,119,573 | A | 9/2000 | Berens et al. |
| 5,115,859 | A | 5/1992 | Roebelen, Jr. et al. | 6,120,530 | A | 9/2000 | Nuckols et al. |
| 5,134,031 | A | 7/1992 | Kagechi et al. | 6,125,645 | A | 10/2000 | Horn |
| 5,140,004 | A | 8/1992 | Tamaka et al. | 6,136,217 | A | 10/2000 | Haget et al. |
| 5,153,066 | A * | 10/1992 | Tanaka et al. ............... 428/373 | 6,170,561 | B1 | 1/2001 | O'Grady |
| 5,162,074 | A | 11/1992 | Hills | 6,171,647 | B1 | 1/2001 | Holman |
| 5,202,150 | A | 4/1993 | Benson et al. | 6,179,879 | B1 | 1/2001 | Robinson et al. |
| 5,211,949 | A | 5/1993 | Salyer | 6,183,855 | B1 | 2/2001 | Buckley |
| 5,220,954 | A | 6/1993 | Longardner et al. | 6,185,742 | B1 | 2/2001 | Doherty |
| 5,254,380 | A | 10/1993 | Salyer | 6,197,415 | B1 | 3/2001 | Holman |
| 5,282,994 | A | 2/1994 | Salyer | 6,207,738 | B1 | 3/2001 | Zuckerman et al. |
| 5,290,904 | A | 3/1994 | Colvin et al. | 6,214,303 | B1 | 4/2001 | Hoke et al. |
| 5,296,904 | A | 3/1994 | Jackson | 6,217,889 | B1 | 4/2001 | Lorenzi et al. |
| 5,366,801 | A * | 11/1994 | Bryant et al. ............... 442/131 | 6,217,993 | B1 | 4/2001 | Pause |
| 5,370,814 | A | 12/1994 | Salyer | 6,230,444 | B1 | 5/2001 | Pause |
| 5,381,670 | A | 1/1995 | Tippmann et al. | 6,277,439 | B1 | 8/2001 | Painter |
| 5,386,701 | A | 2/1995 | Cao | 6,362,389 | B1 | 3/2002 | Mcdowall et al. |
| RE34,880 | E | 3/1995 | Salyer | 6,417,122 | B1 | 7/2002 | Newkirk et al. |
| 5,415,222 | A | 5/1995 | Colvin et al. | 6,689,466 | B2 | 2/2004 | Hartmann |
| 5,424,519 | A | 6/1995 | Salee | 6,703,127 | B2 | 3/2004 | Davis et al. |
| 5,435,376 | A | 7/1995 | Hart et al. | 6,716,498 | B2 | 4/2004 | Curro et al. |
| 5,477,917 | A | 12/1995 | Salyer | 6,793,856 | B2 | 9/2004 | Hartmann et al. |
| 5,499,460 | A | 3/1996 | Bryant et al. | 6,835,334 | B2 | 12/2004 | Davis et al. |
| 5,501,268 | A | 3/1996 | Stovall et al. | 6,855,422 | B2 | 2/2005 | Magill et al. |
| 5,507,337 | A | 4/1996 | Rafalovich et al. | 6,981,955 | B1 | 1/2006 | Schultze et al. |
| 5,532,039 | A | 7/1996 | Payne et al. | 7,241,497 | B2 * | 7/2007 | Magill et al. ................. 428/373 |
| 5,552,075 | A | 9/1996 | Salyer | 2002/0054964 | A1 | 5/2002 | Hartmann |
| 5,565,132 | A * | 10/1996 | Salyer ......................... 252/70 | 2003/0026973 | A1 | 2/2003 | Pause |
| 5,626,936 | A | 5/1997 | Alderman | 2003/0035951 | A1 | 2/2003 | Magill |
| 5,637,389 | A | 6/1997 | Colvin et al. | | | | |
| 5,647,226 | A | 7/1997 | Scaringe et al. | | | | |

FOREIGN PATENT DOCUMENTS

| | | |
|---|---|---|
| CN | 1165877 A1 | 11/1997 |
| EP | 0 306 202 A2 | 3/1989 |
| JP | 63-218200 | 3/1989 |
| JP | 03-059134 A | 3/1991 |
| JP | 02-289916 | 6/1992 |
| JP | 4-163370 | 6/1992 |
| JP | 6-200417 | 7/1994 |
| JP | 8-311716 | 11/1996 |
| JP | 8-311716 A | 11/1996 |
| JP | 8311716 | 11/1996 |
| JP | 08311716 A * | 11/1996 |
| JP | 08311716 A1 | 11/1996 |
| JP | 9-143462 | 6/1997 |
| JP | 11-200152 A | 7/1999 |
| JP | 10-337362 | 6/2000 |

| | | | |
|---|---|---|---|
| 5,669,584 | A | 9/1997 | Hickey |
| 5,677,048 | A | 10/1997 | Pushaw |
| 5,687,706 | A | 11/1997 | Goswami et al. |
| 5,707,735 | A | 1/1998 | Midkif et al. |
| 5,709,914 | A | 1/1998 | Hayes |
| 5,722,482 | A | 3/1998 | Buckley |
| 5,750,962 | A | 5/1998 | Hyatt |
| 5,755,216 | A | 5/1998 | Salyer |
| 5,755,987 | A * | 5/1998 | Goldstein et al. ............. 252/70 |
| 5,755,988 | A | 5/1998 | Lane et al. |
| 5,763,335 | A | 6/1998 | Hermann |
| 5,765,389 | A | 6/1998 | Salyer |
| 5,770,295 | A | 6/1998 | Alderman |
| 5,785,884 | A | 7/1998 | Hammond |
| 5,788,912 | A | 8/1998 | Salyer |
| 5,804,297 | A | 9/1998 | Colvin et al. |

| | | |
|---|---|---|
| JP | 00160450 | 6/2000 |
| JP | 2000160450 A1 | 6/2000 |
| JP | 2001-172866 | 6/2001 |
| JP | 2002317329 A1 | 10/2002 |
| JP | 2002-317329 | 12/2002 |
| JP | 2002-348780 | 12/2002 |
| KR | 2004099652 | 12/2004 |
| TW | 422898 | 2/2001 |
| WO | WO 87/07854 | 12/1987 |
| WO | WO 93/15625 | 8/1993 |
| WO | WO 93/24241 | 12/1993 |
| WO | WO 95/29057 | 11/1995 |
| WO | WO 95/34609 | 12/1995 |
| WO | WO 97/43512 | 11/1997 |
| WO | WO 98/42929 | 10/1998 |
| WO | WO 98/45208 | 10/1998 |
| WO | WO 98/46669 | 10/1998 |
| WO | WO 99/25549 | 5/1999 |
| WO | WO 00/61360 | 10/2000 |
| WO | WO 00/65100 | 11/2000 |
| WO | WO 01/35511 | 5/2001 |
| WO | WO 01/38810 | 5/2001 |
| WO | WO 02/12607 | 2/2002 |
| WO | WO 02/24789 | 3/2002 |
| WO | WO 02/24830 | 3/2002 |
| WO | WO 02/24992 | 3/2002 |
| WO | WO 0224992 | 3/2002 |

OTHER PUBLICATIONS

Fourne, Franz Synthetic Fibers—Machines and Equipment Manufacture, Properties (1999). (pp. 539-546). Hanser Publishers. Online version available at: http://www.knovel.com/knovel2/Toc.jsp?BookID=1005&VerticalID=0.*
Gilmore, David G. Spacecraft Thermal Control Handbook (2002), vol. 1—Fundamental Technologies (2nd Edition). (pp. 373-403). American Institute of Aeronautics and Astronautics. Online version available at: http://www.knovel.com/knovel2/Toc.jsp?BookID=1593&VerticalID=0.*
Wang, Z.L.; Kang, Z.C. (1998). Functional and Smart Materials—Structural Evolution and Structure Analysis. (pp. 1-20). Springer—Verlag. Online version available at: http://www.knovel.com/knovel2/Toc.jsp?BookID=906&VerticalID=0.*
Office action dated Jun. 29, 2007 in related U.S. Appl. No. 11/562,742, and accompanying documents.
Supplementary European Search Report, Aug. 29, 2007, 4 pages.
PCT-Notification concerning transmittal of International Preliminary Report on Patentability (Chapter 1 of the Patent Cooperation Treaty), filed Nov. 14, 2005, mailed Aug. 16, 2007, 9 pages, PCT Application No. PCT/US2005/041030.
European Patent Office, "Extended European Search Report in EP Patent Application No. 05851572.7", Jul. 4, 2008, p. 8, Published in: The Hague.
USPTO, "Office Action in U.S. Appl. No. 11/562,732", Jul. 14, 2008, p. 41, Published in: US.
Craig Neugeboren, "Amendment and Response Under 37 CFR 1.111 in U.S. Appl. No. 11/562,732", filed Sep. 29, 2008, p. 9, Published in: US.
Chinese Patent Office, "Final Rejection in Chinese Patent Application No. 02822457.4", Dec. 19, 2008, p. 18, Publisher: State Intellectual Property Office of the People's Republic of China, Published in: CN.
EPO, "Summons to attend oral proceedings in EP Application No. 02731393.1", Oct. 28, 2008, p. 3, Publisher: European Patent Office, Published in: Munich, Germany.
Japanese Patent Office, "Office Action in Japan Patent Application No. 2003-530923", Oct. 2, 2007, p. 28, Publisher: Japanese Patent Office, Published in: Japan.
Korean Intellectual Property Office, "Notice of Grounds for rejection in Korean Patent Application No. 2004-7004143", Jan. 28, 2009, p. 39, Publisher: Korean Intellectual Property Office, Published in: Korea.
European Patent Office, "Summons to Attend Oral Proceedings in EP Patent Application No. 06014813.7", Nov. 4, 2008, p. 3, Publisher: European Patent Office, Published in: Munich, Germany.
USPTO, "Office Action in U.S. Appl. No. 11/562,732", Jan. 26, 2009, p. 9, Publisher: United States Patent and Trademark Office, Published in: US.
XP-002187982, JP 08 311716 (abstract) Database WPI, Section Ch, Week 199706.
Bryant, Melt Spun Fibers Containing Microencapsulated Phase Change Material, Advances in heat and Mass Transfer in Biotechnology (1999) HTD-vol. 363/BED-vol. 44, pp. 225-234.
Shimbun, Business Update, The Daily Yomiuri, 2003.
Phase Change Material as Heat Storing Material, Journal of Chemical New Materials, No. 2, 1999.
Crystallization and Low Temperature Heat-Storage Behavior of Peg, Journal of Tianjin Institute of Textile Science and Technology, vol. 16, No. 2, 1997.
JP 8-311716 machine translation dated Nov. 26, 1996.
Crystallization and Low Temperature Heat-Storage Behavior of Peg, Journal of Tianjin Institute of Textile Science and Technology, vol. 16, No. 2, 1997.
USPTO, "Response to Office Action filed in U.S. Appl. No. 11/562,732," dated Apr. 9, 2009.
USPTO, "Office Action in U.S. Appl. No. 11/562,732," dated Jun. 11, 2009.

* cited by examiner

*Primary Examiner*—Jennifer A Chriss
(74) *Attorney, Agent, or Firm*—Neugeboren O'Dowd PC

(57) ABSTRACT

Multi-component fibers having enhanced reversible thermal properties and methods of manufacturing thereof are described. In one embodiment, a multi-component fiber includes a fiber body formed from a set of elongated members, and at least one of the set of elongated members includes a temperature regulating material having a latent heat of at least 40 J/g and a transition temperature in the range of 22° C. to 40° C. The temperature regulating material provides thermal regulation based on at least one of absorption and release of the latent heat at the transition temperature. The multi-component fiber can be formed via a melt spinning process or a solution spinning process and can be used or incorporated in various products where a thermal regulating property is desired. For example, the multi-component fiber can be used in textiles, apparel, footwear, medical products, containers and packagings, buildings, appliances, and other products.

16 Claims, 10 Drawing Sheets

MELT SPUN BICOMPONENT FIBERS WITH REVERSIBLE THERMAL PROPERTIES

| | SAMPLE 1 | SAMPLE 2 | SAMPLE 3 | SAMPLE 4 | SAMPLE 5 | SAMPLE 6 |
|---|---|---|---|---|---|---|
| CORE POLYMER | 15% mPCM CONC. | 15% mPCM CONC. | 15% mPCM CONC. | 15% mPCM CONC. | 15% mPCM CONC. | 15% mPCM CONC. |
| SHEATH POLYMER | PP | PP | PP | NYLON 6 | NYLON 6 | NYLON 6 |
| CORE WT. % | 50 | 75 | 50 | 50 | 75 | 50 |
| SHEATH WT. % | 50 | 25 | 50 | 50 | 25 | 50 |
| WINDING SPEED | 1000 | 1000 | 2000 | 1100 | 1100 | 2000 |
| # FILAMENTS | 64 | 64 | 64 | 64 | 64 | 64 |
| SPIN DENIER | 1152 | 1152 | 400 | 1152 | 1152 | 400 |
| SPIN EASE | EXCELLENT | EXCELLENT | GOOD | EXCELLENT | EXCELLENT | GOOD |
| % mPCM | 7.5 | 11.25 | 7.5 | 7.5 | 11.25 | 7.5 |
| FIBER LATENT HEAT (J/G) | 11.5 | 17.1 | 10.5 | 9.4 | 15.5 | 10.3 |

*FIG. 7*

MULTI-COMPONENT FIBERS HAVING ENHANCED REVERSIBLE THERMAL PROPERTIES

CROSS-REFERENCE TO RELATED APPLICATIONS

This application is a divisional of U.S. patent application Ser. No. 11/078,657, filed on Mar. 11, 2005 now U.S. Pat. No. 7,160,612, which is a continuation-in-part of the patent application of Magill, et al., entitled "Multi-component Fibers Having Enhanced Reversible Thermal Properties and Methods of Manufacturing Thereof," U.S. Ser. No. 11/051,543, filed on Feb. 4, 2005, now abandoned which is a continuation-in-part of the patent application of Magill et al., entitled "Multi-component Fibers Having Enhanced Reversible Thermal Properties and Methods of Manufacturing Thereof," U.S. Ser. No. 10/052,232, filed on Jan. 15, 2002 now U.S. Pat. No. 6,855,422, which is a continuation-in-part of the patents applications of Haggard, entitled "Temperature Adaptable Textile Fibers and Method of Preparing Same," U.S. Ser. No. 09/691,164, filed on Oct. 19, 2000 now abandoned, and Magill et al., entitled "Multi-component Fibers Having Enhanced Reversible Thermal Properties," U.S. Ser. No. 09/960,591, filed on Sep. 21, 2001 now abandoned, which claims the benefit of U.S. Provisional Application Ser. No. 60/234,410, filed on Sep. 21, 2000, the disclosures of which are incorporated herein by reference in their entirety.

FIELD OF THE INVENTION

The invention relates to synthetic fibers having enhanced reversible thermal properties. More particularly, the invention relates to multi-component fibers including phase change materials and to the formation of such fibers via a melt spinning process or a solution spinning process.

BACKGROUND OF THE INVENTION

Many fabrics are made from synthetic fibers. Conventionally, two processes are used to manufacture synthetic fibers: a solution spinning process and a melt spinning process. The solution spinning process is generally used to form acrylic fibers, while the melt spinning process is generally used to form nylon fibers, polyester fibers, polypropylene fibers, and other similar type fibers. As is well known, an acrylic fiber includes a long-chain synthetic polymer characterized by the presence of acrylonitrile units, a nylon fiber includes a long-chain synthetic polyamide polymer characterized by the presence of an amide group —CONH—, a polyester fiber includes a long-chain synthetic polymer having at least 85 percent by weight of an ester of a substituted aromatic carboxylic acid unit, and a polypropylene fiber includes a long-chain synthetic crystalline polymer having at least 85 percent by weight of an olefin unit and typically having a number average molecular weight of about 40,000 or more.

The melt spinning process is of particular interest, since a large portion of the synthetic fibers that are used in the textile industry are manufactured by this technique. The melt spinning process generally involves passing a molten polymeric material through a device that is known as a spinneret to thereby form a set of individual synthetic fibers. Once formed, the synthetic fibers can be collected into a strand or cut into staple fibers. Synthetic fibers can be used to make knitted, woven, or non-woven fabrics, or, alternatively, synthetic fibers can be spun into a yarn to be used thereafter in a weaving or a knitting process to form a synthetic fabric.

Phase change materials have been incorporated into mono-component acrylic fibers to provide enhanced reversible thermal properties to the fibers themselves as well as to fabrics made therefrom. This is readily accomplished, in part due to the high levels of volatile materials (e.g., solvents) typically associated with the solution spinning process of forming acrylic fibers. However, it is more problematic to incorporate phase change materials into melt spun synthetic fibers, since high levels of volatile materials typically are not present or desired in the melt spinning process Previous attempts to incorporate phase change materials into melt spun synthetic fibers typically involved mixing microcapsules containing a phase change material with a standard fiber-grade thermoplastic polymer to form a blend and subsequently melt spinning this blend to form mono-component synthetic fibers. Such attempts generally led to inadequate dispersion of the microcapsules within the fibers, poor fiber properties, and poor processability unless low concentrations of the microcapsules were used. However, with low concentrations of the microcapsules, the desired enhanced reversible thermal properties normally associated with use of phase change materials are difficult to realize.

It is against this background that a need arose to develop the multi-component fibers described herein.

SUMMARY OF THE INVENTION

In one aspect, the invention relates to a multi-component fiber. In one embodiment, the multi-component fiber includes a fiber body formed from a set of elongated members, and at least one of the set of elongated members includes a temperature regulating material having a latent heat of at least 40 J/g and a transition temperature in the range of 22° C. to 40° C. The temperature regulating material provides thermal regulation based on at least one of absorption and release of the latent heat at the transition temperature.

In another embodiment, the multi-component fiber includes a core member including a phase change material having a latent heat of at least 40 J/g and a transition temperature in the range of 10° C. to 50° C. The phase change material provides thermal regulation based on at least one of absorption and release of the latent heat at the transition temperature. The multi-component fiber also includes a sheath member surrounding the core member and forming an exterior of the multi-component fiber.

In still another embodiment, the multi-component fiber includes a set of island members, and at least one of the set of island members includes a phase change material having a latent heat of at least 40 J/g and a transition temperature in the range of 10° C. to 50° C. The phase change material provides thermal regulation based on at least one of absorption and release of the latent heat at the transition temperature. The multi-component fiber also includes a sea member surrounding the set of island members and forming an exterior of the multi-component fiber In another aspect, the invention relates to a fabric. In one embodiment, the fabric includes a set of multi-component fibers blended together. Each of the set of multi-component fibers includes a fiber body formed from a set of elongated members, and at least one of the set of elongated members includes a phase change material having a transition temperature in the range of 22° C. to 40° C. The phase change material provides thermal regulation based on at least one of melting and crystallization of the phase change material at the transition temperature. The fabric has a latent heat of at least 2 J/g.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 7 illustrates a number of properties and manufacturing parameters of six core/sheath fibers that were produced as discussed in Example 1.

DETAILED DESCRIPTION

Figure 1:
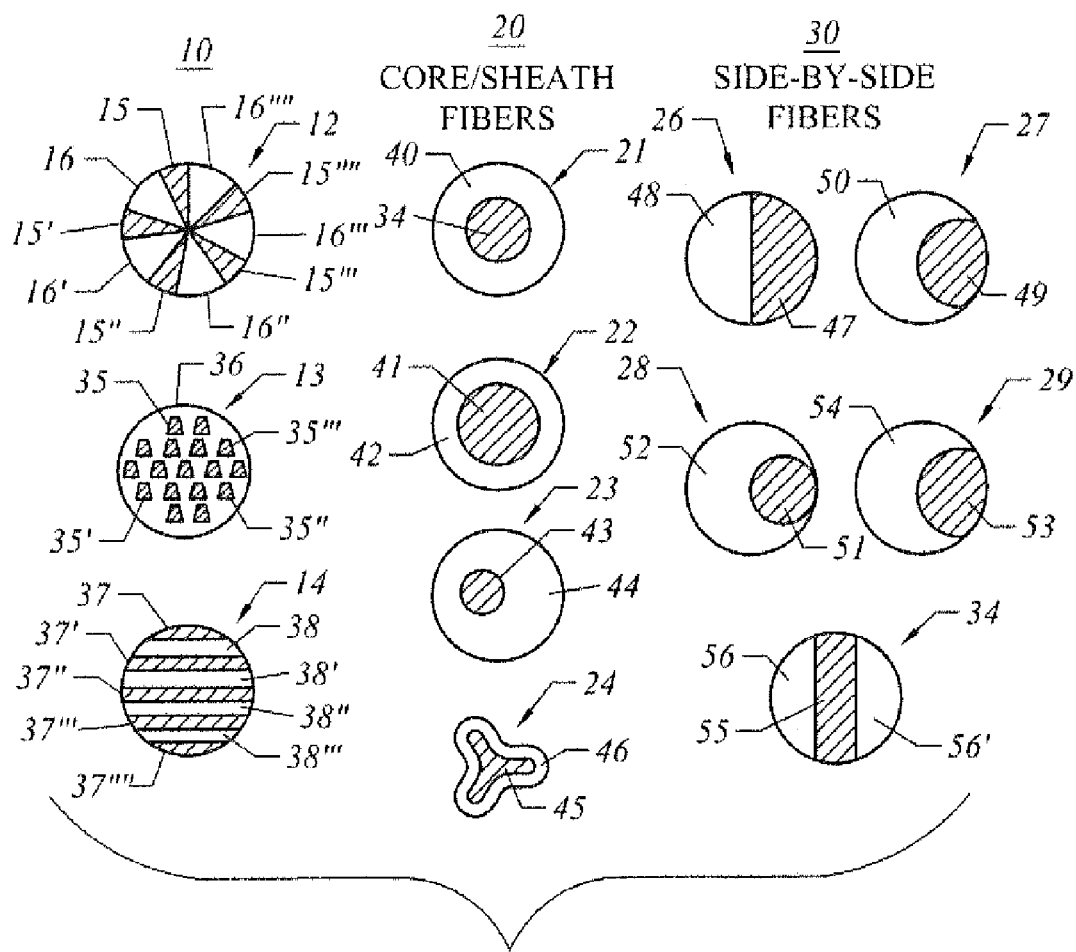
FIG. 1 and FIG. 2 illustrate enlarged cross sectional views of various multi-component fibers according to some embodiments of the invention.

Embodiments of the invention relate to multi-component fibers having enhanced reversible thermal properties and methods of manufacturing thereof. Multi-component fibers in accordance with various embodiments of the invention have the ability to absorb and release thermal energy under different environmental conditions. In addition, such multi-component fibers can exhibit improved processability (e.g., during manufacturing of the fibers or of a product made therefrom), improved strength, improved containment of a phase change material within the fibers, or higher loading levels of the phase change material. The multi-component fibers can be used or incorporated in various products to provide a thermal regulating property while providing improved strength to the products. For example, multi-component fibers in accordance with various embodiments of the invention can be used in textiles (e.g., fabrics), apparel (e.g., outdoor clothing, drysuits, and protective suits), footwear (e.g., socks, boots, and insoles), medical products (e.g., diapers, medical drapes, thermal blankets, therapeutic pads, incontinent pads, and hot cold packs), containers and packagings (e.g., beverage/food containers, food warmers, seat cushions, and circuit board laminates) buildings (e.g., insulation in walls or ceilings, wallpaper, curtain linings, pipe wraps, carpets, and tiles), appliances (e.g., insulation in house appliances), and other products (e.g., automotive lining material, sleeping bags, and bedding).

Multi-component fibers in accordance with various embodiments of the invention can provide an improved level of comfort when incorporated in products such as, for example, apparel or footwear. In particular, the multi-component fibers can provide such improved level of comfort under different or changing environmental conditions. The use of phase change materials allows the multi-component fibers to provide "multi-directional" or "dynamic" thermal regulation rather than "unidirectional" or "static" thermal regulation. In particular, in accordance with "multi-directional" thermal regulation, the multi-component fibers can absorb thermal energy in warm weather as well as release thermal energy in cold weather. In such manner, the multi-component fibers can provide cooling in warm weather and heating in cold weather, thus maintaining a desired level of comfort under different weather conditions. And, in accordance with "dynamic" thermal regulation, the multi-component fibers can adapt or adjust their thermal regulating property under changing environmental conditions. In such manner, the multi-component fibers can be capable of multiple uses, such as for both warm weather and cold weather. Moreover, the multi-component fibers can adapt or adjust their thermal regulating property without requiring an external triggering mechanism, such as moisture or sunlight.

In conjunction with a thermal regulating property provided, multi-component fibers in accordance with various embodiments of the invention when incorporated, for example, in apparel or footwear can provide other improvements in a level of comfort. For example, the multi-component fibers can provide a reduction in an individual's skin moisture, such as due to perspiration. In particular, the multi-component fibers can lower the temperature or the relative humidity of the skin, thereby providing a lower degree of skin moisture and a higher level of comfort. The use of specific materials and specific apparel or footwear design features can further enhance the level of comfort. For example, the multi-component fibers can be used in conjunction with certain additives, treatments, or coatings to provide further benefits in thermal regulating and moisture management properties.

A multi-component fiber according to some embodiments of the invention can include a set of elongated members As used herein, the term "set" can refer to a collection of one or more elements. According to some embodiments of the invention, the multi-component fiber can include a fiber body formed from the elongated members. The fiber body typically will be elongated and can have a length that is several times (e.g., 100 times or more) greater than its diameter. The fiber body can have a variety of regular or irregular cross sectional shapes, such as, by way of example and not by limitation, circular, multi-lobal, octagonal, oval, pentagonal, rectangular, square-shaped, trapezoidal, triangular, wedge-shaped, and so forth. According to some embodiments of the invention, two or more of the elongated members (e.g., two adjacent elongated members) can be joined, combined, united, or bonded to form a unitary fiber body.

According to some embodiments of the invention, at least one of the elongated members will include a temperature regulating material. Typically, the temperature regulating material will include one or more phase change materials to provide the multi-component fiber with enhanced reversible thermal properties. In some embodiments of the invention, the elongated members can include the same or different polymeric materials, and at least one of the elongated members can have the temperature regulating material dispersed therein. Typically, the temperature regulating material will be uniformly dispersed within at least one of the elongated members. However, depending upon the particular characteristics desired from the multi-component fiber, the dispersion of the temperature regulating material can be varied within one or more of the elongated members. According to some embodiments of the invention, two or more elongated members can include the same or different temperature regulating materials.

Depending upon the particular application of the multi-component fiber, the elongated members can be arranged in one of a variety of configurations. For example, the elongated members can be arranged in an island-in-sea configuration or a core-sheath configuration. The elongated members can be arranged in other configurations, such as, by way of example and not by limitation, a matrix or checkerboard configuration, a segmented-pie configuration, a side-by-side configuration, a striped configuration, and so forth. According to some embodiments of the invention, the elongated members can be arranged in a bundle form wherein the elongated members are generally parallel with respect to one another. According to other embodiments of the invention, one or more elongated members can extend through at least a portion of the length of the fiber body, and, if desired, the elongated members can be longitudinally coextensive. For example, according to some embodiments of the invention, at least one inner member can extend through substantially the length of the multi-component fiber and can include a temperature regulating material. The extent to which the inner member extends through the length of the multi-component fiber can depend on, for example, desired thermal regulating properties for the multi-component fiber. In addition, other factors (e.g., desired mechanical properties or method of forming the multi-component fiber) can play a role in determining this extent. Thus, in one embodiment, the inner member can extend through from about a half up to the entire length of the multi-component fiber to provide desired thermal regulating properties. An outer member can surround the inner member and form the exterior of the multi-component fiber.

According to some embodiments of the invention, the multi-component fiber can be between about 0.1 to about 1,000 denier or between about 0.1 to about 100 denier. Typically, the multi-component fiber according to an embodiment of the invention can be between about 0.5 to about 10 denier. As one of ordinary skill in the art will understand, a denier is typically understood to be a measure of weight per unit length of a fiber (i.e., grams per 9000 meters).

If desired, the multi-component fiber according to some embodiments of the invention can be further processed to form one or more smaller denier fibers. For example, the elongated members forming the multi-component fiber can be split apart to form two or more smaller denier fibers, wherein each smaller denier fiber can include one or more of the elongated members. Alternatively, or in conjunction, one or more elongated members (or a portion or portions thereof) forming the multi-component fiber can be dissolved or melted away to yield one or more smaller denier fibers. Typically, at least one resulting smaller denier fiber will include a temperature regulating material to provide desired thermal regulating properties.

Depending upon the method of manufacturing the multi-component fiber, desirability of further processing, or particular application of the multi-component fiber, the multi-component fiber can further include one or more additives, such as, by way of example and not by limitation, water, surfactants, dispersants, anti-foam agents (e.g., silicone containing compounds and fluorine containing compounds), antioxidants (e.g., hindered phenols and phosphites), thermal stabilizers (e.g., phosphites, organophosphorous compounds, metal salts of organic carboxylic acids, and phenolic compounds), light or UV stabilizers (e.g., hydroxy benzoates, hindered hydroxy benzoates, and hindered amines), light or UV absorbing additives (e.g. ceramic particles of Group IV transition metal carbides and oxides), microwave absorbing additives (e.g., multifunctional primary alcohols, glycerine, and carbon), reinforcing fibers (e.g., carbon fibers, aramid fibers, and glass fibers), conductive fibers or particles (e.g., graphite or activated carbon fibers or particles), lubricants, process aids (e.g., metal salts of fatty acids, fatty acid esters, fatty acid ethers, fatty acid amides, sulfonamides, polysiloxanes, organophosphorous compounds, silicon containing compounds, fluorine containing compounds, and phenolic polyethers), fire retardants (e.g., halogenated compounds, phosphorous compounds, organophosphates, organobromides, alumina trihydrate, melamine derivatives, magnesium hydroxide, antimony compounds, antimony oxide, and boron compounds), anti-blocking additives (e.g., silica, talc, zeolites, metal carbonates, and organic polymers), anti-fogging additives (e.g., non-ionic surfactants, glycerol esters, polyglycerol esters, sorbitan esters and their ethoxylates, nonyl phenyl ethoxylates, and alcohol ethyoxylates), anti-static additives (e.g., non-ionics such as fatty acid esters, ethoxylated alkylamines, diethanolamides, and ethoxylated alcohol; anionics such as alkylsulfonates and alkylphosphates; cationics such as metal salts of chlorides, methosulfates or nitrates, and quaternary ammonium compounds; and amphoterics such as alkylbetaines), anti-microbials (e.g., arsenic compounds, sulfur, copper compounds, isothiazolins phthalamides, carbamates, silver base inorganic agents, silver zinc zeolites, silver copper zeolites, silver zeolites, metal oxides, and silicates), crosslinkers or controlled degradation agents (e.g., peroxides, azo compounds, and silanes), colorants, pigments, dyes, fluorescent whitening agents or optical brighteners (e.g., bis-benzoxazoles, phenylcoumarins, and bis-(styryl)biphenyls), fillers (e.g., natural minerals and metals such as oxides, hydroxides, carbonates, sulfates, and silicates; talc; clay; wollastonite; graphite; carbon black; carbon fibers; glass fibers and beads; ceramic fibers and beads; metal fibers and beads; flours; and fibers of natural or synthetic origin such as fibers of wood, starch, or cellulose flours), coupling agents (e.g., silanes, titanates, zirconates, fatty acid salts, anhydrides, epoxies, and unsaturated polymeric acids), reinforcement agents, crystallization or nucleation agents (e.g., any material which increases or improves the crystallinity in a polymer, such as to improve rate/kinetics of crystal growth, number of crystals grown, or type of crystals grown), and so forth. The one or more additives can be dispersed within one or more of the elongated members forming the multi-component fiber.

According to some embodiments of the invention, certain treatments or coatings can be applied to the multi-component fiber to impart additional properties, such as, by way of example and not by limitation, stain resistance, water repellency, softer feel, and moisture management properties.

Examples of treatments and coatings include Epic (available from Nextec Applications Inc., Vista, Calif.), Intera (available from Intera Technologies, Inc., Chattanooga, Tenn.), Zonyl Fabric Protectors (available from DuPont Inc., Wilmington, Del.), Scotchgard (available from 3M Co., Maplewood, Minn.), and so forth.

Figure 2:
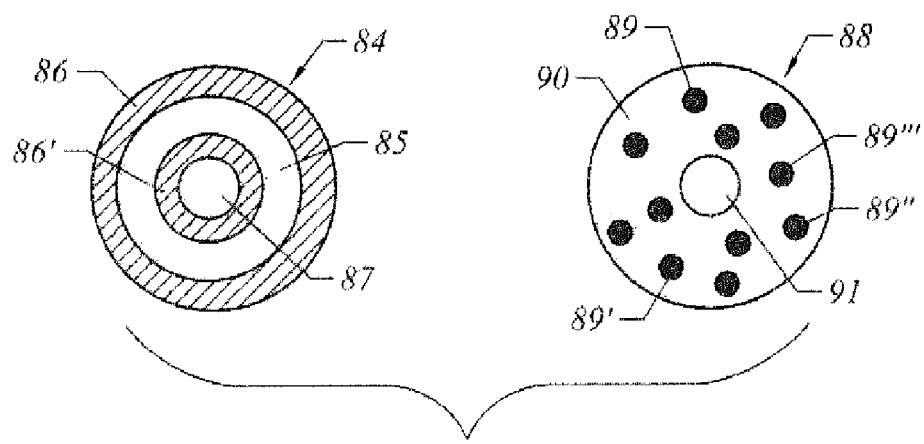

With reference to FIG. 1 and FIG. 2, enlarged cross sectional views of various multi-component fibers 12, 13, 14, 21, 22, 23, 24, 26, 27, 28, 29, 34, 84, and 88 according to some embodiments of the invention are illustrated. More particularly, FIG. 1 and FIG. 2 illustrate a variety of configurations of arranging elongated members forming the multi-component fibers, according to some embodiments of the invention.

As shown in FIG. 1 and FIG. 2, each multi-component fiber (e.g., 21) includes a set of distinct cross sectional regions corresponding to a set of elongated members (e.g., 39 and 40) that form the multi-component fiber. According to the presently illustrated embodiments, the elongated members include a first elongated member (or a first set of elongated members) (e.g., shown shaded in FIG. 1) and a second elongated member (or a second set of elongated members) (e.g., shown unshaded in FIG. 1). Here, the first elongated member (or the first set of elongated members) preferably can be formed from a polymeric material that has a temperature regulating material dispersed therein. The second elongated member (or the second set of elongated members) can be formed from the same polymeric material or another polymeric material having somewhat different properties. It should be recognized that the number, shapes, and sizes of the elongated members shown in FIG. 1 and FIG. 2 are illustrated by way of example and not by limitation, and various other embodiments are within the scope of the invention.

While FIG. 1 and FIG. 2 illustrate multi-component fibers with circular or tri-lobal cross sectional shapes, multi-component fibers with a variety of other regular or irregular cross sectional shapes are encompassed by the invention, such as, by way of example and not by limitation, multi-lobal, octagonal, oval, pentagonal, rectangular, square-shaped, trapezoidal, triangular, wedge-shaped, and so forth. It should be recognized that, in general, a first set of elongated members can be formed from the same or different polymeric materials, and a second set of elongated members can be formed from the same or different polymeric materials. Moreover, a temperature regulating material can be dispersed within a second elongated member (or a second set of elongated members), according to some embodiments of the invention. It should be further recognized that two or more different temperature regulating materials can be dispersed within the same or different elongated members. For example, a first temperature regulating material can be dispersed within a first elongated member, and a second temperature regulating material having somewhat different properties can be dispersed within a second elongated member (e.g., two different phase change materials).

According to some embodiments of the invention, one or more elongated members can be formed from a temperature regulating material that need not be dispersed within a polymeric material. For example, the temperature regulating material can include a polymer (or a mixture of polymers) that provides enhanced reversible thermal properties and that can be used to form a first elongated member (or a first set of elongated members). For such embodiments of the invention, it can be desirable, but not required, that a second elongated member (or a second set of elongated members) adequately surrounds the first elongated member (or the first set of elongated members) to reduce or prevent loss or leakage of the temperature regulating material. In addition, it should be recognized that, in general, two or more elongated members can be formed from the same or different temperature regulating materials.

With reference to FIG. 1, left-hand column 10 illustrates three multi-component fibers 12, 13, and 14. The multi-component fiber 12 includes a set of elongated members arranged in a segmented-pie configuration. In the present embodiment, a first set of elongated members 15, 15', 15", 15'", and 15"" and a second set of elongated members 16, 16', 16", 16'", and 16"" are arranged in an alternating fashion and have cross sectional areas that are wedge-shaped. In general, the elongated members can have the same or different cross sectional shapes or sizes. Moreover, while the multi-component fiber 12 is shown including ten elongated members, it should be recognized that, in general, two or more elongated members can be arranged in a segmented-pie configuration, and at least one of the elongated members typically will include a temperature regulating material.

The multi-component fiber 13 includes a set of elongated members arranged in an island-in-sea configuration. In the present embodiment, a first set of elongated members 35, 35' 35", 35'", etc. extends through substantially the length of the multi-component fiber 13 and are separated from each other. The first set of elongated members 35, 35' 35", 35'", etc. is shown positioned within and completely surrounded by a second elongated member 36, thereby forming "islands" within the "sea" of the second elongated member 36. The arrangement of these "islands" within the "sea" can serve to provide a more uniform distribution of a temperature regulating material within the multi-component fiber 13. In the present embodiment, each of the first set of elongated members 35, 35' 35", 35'", etc. has a cross sectional shape that is trapezoidal. It should be recognized, however, that a variety of other regular or irregular cross sectional shapes are encompassed by the invention, such as, by way of example and not by limitation, circular, multi-lobal, octagonal, oval, pentagonal, rectangular, square-shaped, triangular, wedge-shaped, and so forth. In general, the first set of elongated members 35, 35', 35", 35'", etc. can have the same or different cross sectional shapes or sizes. Moreover, while the multi-component fiber 13 is shown with seventeen elongated members 35, 35', 35", 35'", etc. positioned within and surrounded by the second elongated member 36, it should be recognized that, in general, one or more elongated members can be positioned within and surrounded by the second elongated member 36.

The multi-component fiber 14 includes a set of elongated members arranged in a striped configuration. In the present embodiment, a first set of elongated members 37, 37', 37", 37'", and 37"" and a second set of elongated members 38, 38', 38", and 38'" are arranged in an alternating fashion and are shaped as longitudinal slices of the multi-component fiber 14. In general, the elongated members can have the same or different cross sectional shapes or sizes (e.g., widths associated with the longitudinal slices). If desired, the multi-component fiber 14 can be a self-crimping or self-texturing fiber, wherein the fiber's crimping or texturing imparts loft, bulk, insulation, stretch, or other like properties. While the multi-component fiber 14 is shown including nine elongated members, it should be recognized that, in general, two or more elongated members can be arranged in a striped configuration, and at least one of the elongated members typically will include a temperature regulating material.

In the case of the multi-component fibers 12 and 14, a first elongated member (e.g., 15) is shown partially surrounded by an adjacent second elongated member or members (e.g., 16 and 16""), whereas, in the case of the multi-component fiber 13, a first elongated member (e.g., 35) is shown completely surrounded by a unitary second elongated member 36. When a first elongated member (e.g., 15) is not completely surrounded, it can be desirable, but not required, that a containment structure (e.g., microcapsules) be used to contain a phase change material dispersed within the first elongated member. If desired, the multi-component fibers 12, 13, and 14 can be further processed to form one or more smaller denier fibers. Thus, for example, the elongated members forming the multi-component fiber 12 can be split apart, or one or more of the elongated members (or a portion or portions thereof) can be dissolved or melted away. A resulting smaller denier fiber can, for example, include the elongated members 15 and 16 that can be joined to one another.

Middle column 20 of FIG. 1 illustrates four core/sheath fibers 21, 22, 23, and 24. In particular, the core/sheath fibers 21, 22, 23, and 24 each includes a set of elongated members arranged in a core-sheath configuration.

The core/sheath fiber 21 includes a first elongated member 39 positioned within and surrounded by a second elongated member 40. More particularly, the first elongated member 39 is formed as a core member that includes a temperature regulating material. This core member is shown concentrically positioned within and completely surrounded by the second elongated member 40 that is formed as a sheath member. Here, the core/sheath fiber 21 includes 25 percent by weight of the core member and 75 percent by weight of the sheath member.

The core/sheath fiber 22 includes a first elongated member 41 positioned within and surrounded by a second elongated member 42. As with the previously discussed embodiment, the first elongated member 41 is formed as a core member that includes a temperature regulating material and is concentrically positioned within and completely surrounded by the second elongated member 42 that is formed as a sheath member. Here, the core/sheath fiber 22 includes 50 percent by weight of the core member and 50 percent by weight of the sheath member.

The core/sheath fiber 23 includes a first elongated member 43 positioned within and surrounded by a second elongated member 44. In the present embodiment, however, the first elongated member 43 is formed as a core member that is eccentrically positioned within the second elongated member 44 that is formed as a sheath member. The core/sheath fiber 23 can include virtually any percentages by weight of the core member and the sheath member to provide desired thermal regulating and mechanical properties.

The tri-lobal core/sheath fiber 24 includes a first elongated member 45 positioned within and surrounded by a second elongated member 46. In the present embodiment, the first elongated member 45 is formed as a core member that has a tri-lobal cross sectional shape This core member is concentrically positioned within the second elongated member 46 that is formed as a sheath member. The core/sheath fiber 23 can include virtually any percentages by weight of the core member and the sheath member to provide desired thermal regulating and mechanical properties.

It should be recognized that a core member can, in general, have a variety of regular or irregular cross sectional shapes, such as, by way of example and not by limitation, circular, multi-lobal, octagonal, oval, pentagonal, rectangular, square-shaped, trapezoidal, triangular, wedge-shaped, and so forth. While the core/sheath fibers 21, 22, 23, and 24 are shown with one core member positioned within and surrounded by a sheath member, it should be recognized that two or more core members can be positioned within and surrounded by a sheath member (e.g., in a manner similar to that shown for the multi-component fiber 13). These two or more core members can have the same or different cross sectional shapes or sizes. According to some embodiments of the invention, a core/sheath fiber includes three or more elongated members arranged in a core-sheath configuration, wherein the elongated members are shaped as concentric or eccentric longitudinal slices of the core/sheath fiber.

Right-hand column 30 of FIG. 1 illustrates a number of side-by-side fibers in accordance with some embodiments of the invention. In particular, side-by-side fibers 26, 27, 28, 29, and 34 each includes a set of elongated members arranged in a side-by-side configuration.

The side-by-side fiber 26 includes a first elongated member 47 positioned adjacent and partially surrounded by a second elongated member 48. In the present embodiment, the elongated members 47 and 48 have half-circular cross sectional shapes. Here, the side-by-side fiber 26 includes 50 percent by weight of the first elongated member 47 and 50 percent by weight of the second elongated member 48. It should be recognized that the elongated members 47 and 48 can alternatively, or in conjunction, be characterized as being arranged in a segmented-pie or a striped configuration.

The side-by-side fiber 27 includes a first elongated member 49 positioned adjacent and partially surrounded by a second elongated member 50. In the present embodiment, the side-by-side fiber 27 includes 20 percent by weight of the first elongated member 49 and 80 percent by weight of the second elongated member 50. It should be recognized that the elongated members 49 and 50 can alternatively, or in conjunction, be characterized as being arranged in a core-sheath configuration, wherein the first elongated member 49 is eccentrically positioned with respect to and partially surrounded by the second elongated member 50.

The side-by-side fibers 28 and 29 are mixed-viscosity fibers. Each fiber includes a first elongated member 51 or 53 having a temperature regulating material dispersed therein and that is positioned adjacent and partially surrounded by a second elongated member 52 or 54. A mixed viscosity-fiber is typically considered to be a self-crimping or self-texturing fiber, wherein the fiber's crimping or texturing imparts loft, bulk, insulation, stretch, or other like properties. Typically, a mixed-viscosity fiber includes a set of elongated members that are formed from different polymeric materials. For example, for the side-by-side fiber 28, the first elongated member 51 can be formed from a first polymeric material, and the second elongated member 52 can be formed from a second polymeric material that can differ in some fashion from the first polymeric material. In the present embodiment, the first and second polymeric materials can include polymers with different viscosities or molecular weights (e.g., two polypropylenes with different molecular weights or a polypropylene and a polyethylene, respectively). When the side-by-side fiber 28 is drawn, uneven stresses can be created between the two elongated members 51 and 52, and the side-by-side fiber 28 can crimp or bend. According to other embodiments of the invention, the first and second polymeric materials can include polymers having different degrees of crystallinity. For example, the first polymeric material can have a lower degree of crystallinity than the second polymeric material. When the side-by-side fiber 28 is drawn, the first and second polymeric materials can undergo different degrees of crystallization and orientation to "lock" an orientation and strength into the side-by-side fiber 28. A sufficient degree of crystallization can be desired to prevent or reduce reorientation of the side-by-side fiber 28 during heat treatment. The side-by-side fibers 28 and 29 can include virtually any percentages by weight of the first and second elongated members to provide desired thermal regulating, mechanical, and self-crimping or self-texturing properties.

The side-by-side fiber 34 is an ABA fiber including a first elongated member 55 positioned between and partially surrounded by a second set of elongated members 56 and 56'. In the present embodiment, the first elongated member 55 is formed from a first polymeric material that has a temperature regulating material dispersed therein. Here, the second set of elongated members 56 and 56' can be formed from the first polymeric material or from a second polymeric material that can differ in some fashion from the first polymeric material. In general, the elongated members 56 and 56' can have the same or different cross sectional shapes or sizes (e.g., widths associated with the longitudinal slices). It should be recognized that the elongated members 55, 56, and 56' can alternatively, or in conjunction, be characterized as being arranged in a striped configuration.

With reference to FIG. 2, two multi-component fibers 84 and 88 are illustrated. The multi-component fiber 84 includes a set of elongated members arranged in a core/sheath configuration, while the multi-component fiber 88 includes a set of elongated members arranged in an island-in-sea configuration.

The core/sheath fiber 84 includes a first elongated member 85 positioned between and surrounded by a second set of elongated members 86 and 86'. In particular, the elongated members 85, 86, and 86' are shaped as concentric longitudinal slices of the core/sheath fiber 84. In the present embodiment, the first elongated member 85 is formed from a first polymeric material that has a temperature regulating material dispersed therein. Here, the second set of elongated members 86 and 86' can be formed from the first polymeric material or from a second polymeric material that can differ in some fashion from the first polymeric material.

As shown in FIG. 2, the elongated member 86' defines an internal cavity 87 that is formed as a hollow core, and an insulation material, such as air, is positioned in the internal cavity 87. Advantageously, use of the insulation material provides enhanced thermal regulating properties in addition to those provided by the temperature regulating material. The core/sheath fiber 84 can include virtually any percentages by weight of the first elongated member 85, the second set of elongated members 86 and 86', and the insulation material to provide desired thermal regulating and mechanical properties. While the core/sheath fiber 84 is shown with one internal cavity 87, it should be recognized that the core/sheath fiber 84 can include two or more internal cavities, which can have the same or different cross sectional shapes or sizes and can contain the same or different insulation materials. It should be recognized that the elongated members 85, 86, and 86' can alternatively, or in conjunction, be characterized as being arranged in a side-by-side configuration.

The island-in-sea fiber 88 includes a first set of elongated members 89, 89', 89", 89'", etc. positioned within and completely surrounded by a second elongated member 90, thereby forming "islands" within the "sea" of the second elongated member 90. In the present embodiment, the first set of elongated members members 89, 89', 89", 89'", etc. is formed from a first polymeric material that has a temperature regulating material dispersed therein. Here, the second elongated member 90 can be formed from the first polymeric material or from a second polymeric material that can differ in some fashion from the first polymeric material. As discussed previously, the arrangement of these "islands" within the "sea" can serve to provide a more uniform distribution of the temperature regulating material within the island-in-sea fiber 88. In the present embodiment, each of the first set of elongated members 89, 89', 89", 89'", etc. has a cross sectional shape that is circular. It should be recognized, however, that a variety of other regular or irregular cross sectional shapes are contemplated, such as trapezoidal, multi-lobal, octagonal, oval, pentagonal, rectangular, square-shaped, triangular, wedge-shaped, and so forth. In general, the first set of elongated members 89, 89', 89", 89'", etc. can have the same or different cross sectional shapes or sizes.

As shown in FIG. 2, the second elongated member 90 defines an internal cavity 91 that is formed as a hollow core, and an insulation material, such as air, is positioned in the internal cavity 91. Advantageously, use of the insulation material provides enhanced thermal regulating properties in addition to those provided by the temperature regulating material. The island-in-sea fiber 88 can include virtually any percentages by weight of the first set of elongated members 89, 89', 89", 89'", etc., the second elongated member 90, and the insulation material to provide desired thermal regulating and mechanical properties. While the island-in-sea fiber 88 is shown with one internal cavity 91, it should be recognized that the island-in-sea fiber 88 can include two or more internal cavities, which can have the same or different cross sectional shapes or sizes and can contain the same or different insulation materials. Moreover, while the island-in-sea fiber 88 is shown with eleven elongated members 89, 89', 89", 89'", etc. positioned within and surrounded by the second elongated member 90, it should be recognized that, in general, one or more elongated members can be positioned within and surrounded by the second elongated member 90.

Figure 3:
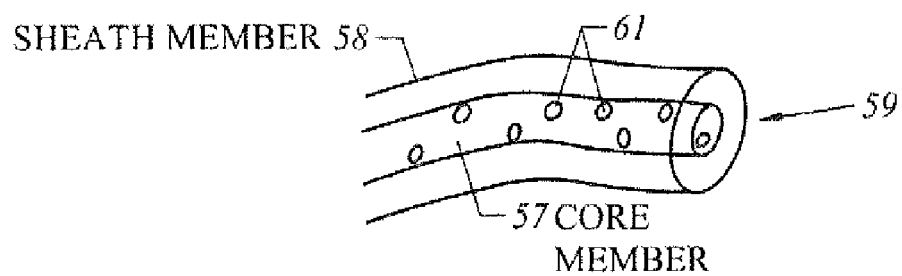
FIG. 3 illustrates a three-dimensional view of a core/sheath fiber according to an embodiment of the invention.

Turning next to FIG. 3, a three-dimensional view of a core/sheath fiber 59 is illustrated. The core/sheath fiber 59 includes an elongated and generally cylindrical core member 57 positioned within and surrounded by an elongated and annular-shaped sheath member 58. In the present embodiment, the core member 57 extends through substantially the length of the core/sheath fiber 59. The core member 57 has a temperature regulating material 61 dispersed therein and is positioned within and completely surrounded or encased by the sheath member 58 that forms the exterior of the core/sheath fiber 59. In the present embodiment, the temperature regulating material 61 includes a set of microcapsules containing a phase change material, and the microcapsules can be uniformly dispersed throughout the core member 57. Those of ordinary skill in the art will appreciate that, while it can be preferred to have the microcapsules evenly dispersed within the core member 57, this is not necessary in all applications. The core member 57 can be concentrically or eccentrically positioned within the sheath member 58, and the core/sheath fiber 59 can include virtually any percentages by weight of the core member 57 and the sheath member 58 to provide desired thermal regulating and mechanical properties.

Figure 4:
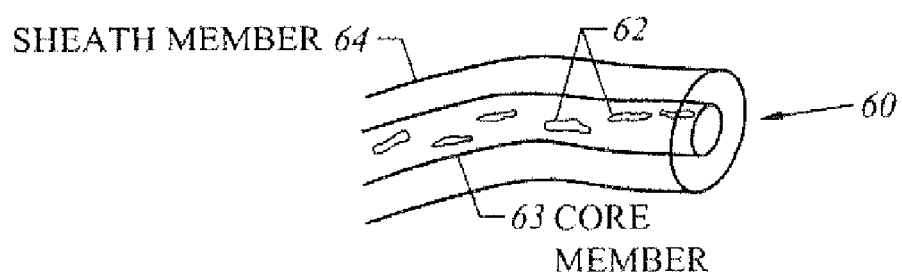
FIG. 4 illustrates a three-dimensional view of another core/sheath fiber according to an embodiment of the invention.

With reference to FIG. 4, a three-dimensional view of another core/sheath fiber 60 is illustrated. As with the core/sheath fiber 59, the core/sheath fiber 60 includes an elongated and generally cylindrical core member 63 extending through substantially the length of the core/sheath fiber 60. The core member 63 is positioned within and completely surrounded or encased by an elongated and annular-shaped sheath member 64 that forms the exterior of the core/sheath fiber 60. Here, a temperature regulating material 62 includes a phase change material in a raw form (e.g., the phase change material is non-encapsulated, i.e., not micro- or macroencapsulated), and the phase change material can be uniformly dispersed throughout the core member 63. Those of ordinary skill in the art will appreciate that, while it can be preferred to have the phase change material evenly dispersed within the core member 63, this is not necessary in all applications. In the present embodiment shown in FIG. 4, the phase change material forms distinct domains that are dispersed within the core member 63. By surrounding the core member 63, the sheath member 64 can serve to enclose the phase change material within the core member 63. Accordingly, the sheath member 64 can reduce or prevent loss or leakage of the phase change material during fiber processing or during end use. The core member 63 can be concentrically or eccentrically positioned within the sheath member 64, and the core/sheath fiber 60 can include virtually any percentages by weight of the core member 63 and the sheath member 64 to provide desired thermal regulating and mechanical properties.

Figure 5:
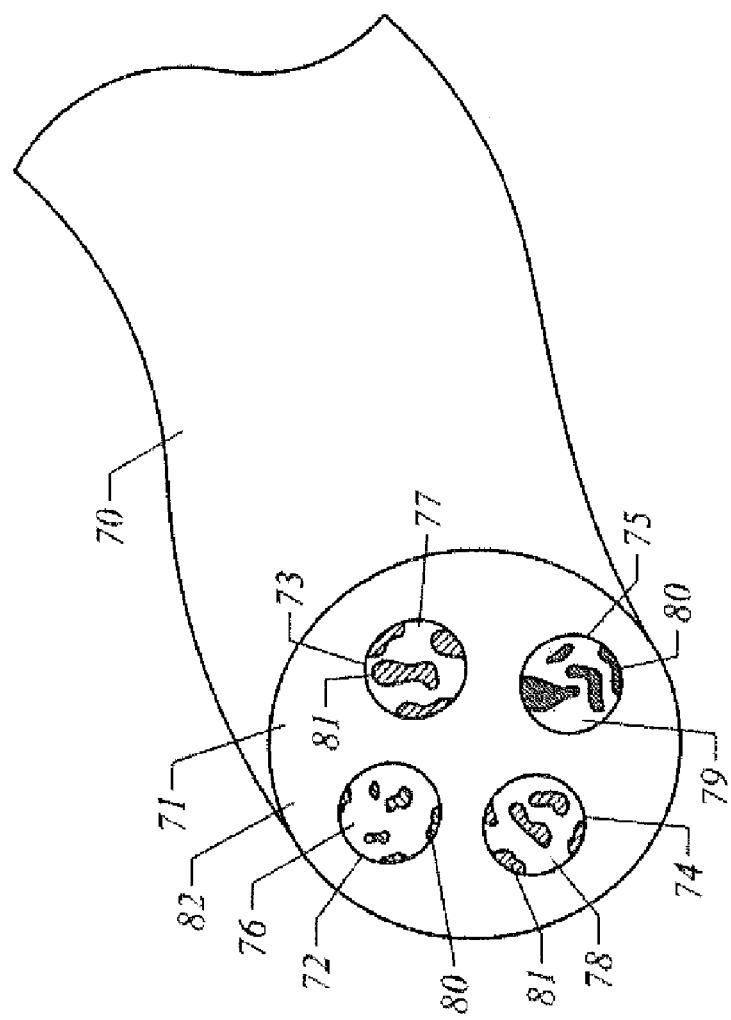
FIG. 5 illustrates a three-dimensional view of an island-in-sea fiber according to an embodiment of the invention.

With reference to FIG. 5, a three-dimensional view of an island-in-sea fiber 70 is illustrated. The island-in-sea fiber 70 includes a set of elongated and generally cylindrical island members 72, 73, 74, and 75 positioned within and completely surrounded or encased by an elongated sea member 71. In the present embodiment, the island members 72, 73, 74, and 75 extend though substantially the length of the island-in-sea fiber 70. While four island members are shown in the present embodiment, it should be recognized that the island-in-sea fiber 70 can include more or less islands members depending on the specific application of the island-in-sea fiber 70. The sea member 71 is formed of a sea polymeric material 82, and the island members 72, 73, 74, and 75 are formed of island polymeric materials 76, 77, 78, and 79, respectively. The sea polymeric material 82 and the island polymeric materials 76, 77, 78, and 79 can be the same or can differ from one another in some fashion. One or more temperature regulating materials can be dispersed within the island members 72, 73, 74, and 75. As shown in FIG. 5, the island-in-sea fiber 70 includes two different temperature regulating materials 80 and 81. The island members 72 and 75 include the temperature regulating material 80, while the island members 73 and 74 include the temperature regulating material 81. Here, the temperature regulating materials 80 and 81 can each include a phase change material in a raw form that forms distinct domains within respective island members. By surrounding the island members 72, 73, 74, and 75, the sea member 71 can serve to enclose the phase change materials within the island-in-sea fiber 70. The island-in-sea fiber 70 can include virtually any percentages by weight of the island members 72, 73, 74, and 75 and the sea member 71 to provide desired thermal regulating and mechanical properties.

As discussed previously, a multi-component fiber according to some embodiments of the invention can include one or more temperature regulating materials. A temperature regulating material typically will include one or more phase change materials. In general, a phase change material can include any substance (or mixture of substances) that has the capability of absorbing or releasing thermal energy to reduce or eliminate heat flow at or within a temperature stabilizing range. The temperature stabilizing range can include a particular transition temperature or a range of transition temperatures. A phase change material used in conjunction with various embodiments of the invention preferably will be capable of inhibiting a flow of thermal energy during a time when the phase change material is absorbing or releasing heat, typically as the phase change material undergoes a transition between two states (e.g., liquid and solid states, liquid and gaseous states, solid and gaseous states, or two solid states). This action is typically transient, e.g., will occur until a latent heat of the phase change material is absorbed or released during a heating or cooling process. As used herein, the term "latent heat" can refer to an amount of heat absorbed or released by a substance (or mixture of substances) as it undergoes a transition between two states. Thermal energy can be stored or removed from a phase change material, and the phase change material typically can be effectively recharged by a source of heat or cold. By selecting an appropriate phase change material, a multi-component fiber can be designed for use in any one of numerous products.

According to some embodiments of the invention, a phase change material can be a solid/solid phase change material. A solid/solid phase change material is a type of phase change material that typically undergoes a transition between two solid states (e.g., a crystalline or mesocrystalline phase transformation) and hence typically does not become a liquid during use.

A phase change material can include a mixture of two or more substances. By selecting two or more different substances and forming a mixture, a temperature stabilizing range can be adjusted for any particular application of a multi-component fiber. According to some embodiments of invention, a mixture of two or more different substances can exhibit two or more distinct transition temperatures or a single modified transition temperature when incorporated in a multi-component fiber.

Phase change materials that can be incorporated in multi-component fibers in accordance with various embodiments of the invention include a variety of organic and inorganic substances. Examples of phase change materials include, by way of example and not by limitation, hydrocarbons (e.g., straight chain alkanes or paraffinic hydrocarbons, branched-chain alkanes, unsaturated hydrocarbons, halogenated hydrocarbons, and alicyclic hydrocarbons), hydrated salts (e.g., calcium chloride hexahydrate, calcium bromide hexahydrate, magnesium nitrate hexahydrate, lithium nitrate trihydrate, potassium fluoride tetrahydrate, ammonium alum, magnesium chloride hexahydrate, sodium carbonate decahydrate, disodium phosphate dodecahydrate, sodium sulfate decahydrate, and sodium acetate trihydrate), waxes, oils, water, fatty acids, fatty acid esters, dibasic acids, dibasic esters, 1-halides, primary alcohols, aromatic compounds, clathrates, semiclathrates, gas clathrates, anhydrides (e.g., stearic anhydride), ethylene carbonate, polyhydric alcohols (e.g., 2,2-dimethyl-1,3-propanediol, 2-hydroxymethyl-2-methyl-1,3-propanediol, ethylene glycol, polyethylene glycol, pentaerythritol, dipentaerythritol, pentaglycerine tetramethylol ethane, neopentyl glycol, tetramethylol propane, 2-amino-2-methyl-1,3-propanediol, monoaminopentaerythritol, diaminopentaerythritol, and tris(hydroxymethyl)acetic acid), polymers (e.g., polyethylene, polyethylene glycol, polyethylene oxide, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyesters produced by polycondensation of glycols (or their derivatives) with diacids (or their derivatives), and copolymers, such as polyacrylate or poly(meth)acrylate with alkyl hydrocarbon side chain or with polyethylene glycol side chain and copolymers including polyethylene, polyethylene glycol, polyethylene oxide, polypropylene, polypropylene glycol, or polytetramethylene glycol), metals, and mixtures thereof.

The selection of a phase change material will typically be dependent upon a desired transition temperature or a desired application of a resulting multi-component fiber. For example, a phase change material having a transition temperature near room temperature can be desirable for applications in which the resulting multi-component fiber is incorporated into apparel or footwear to maintain a comfortable temperature for a user.

A phase change material according to some embodiments of the invention can have a transition temperature ranging from about −40° C. to about 125° C., such as, for example, from about −40° C. to about 100° C. or from about −5° C. to about 125° C. In one preferred embodiment useful for clothing applications, the phase change material will have a transition temperature ranging from about 0° C. to about 50° C., such as, for example, from about 10° C. to about 50° C., from about 15° C. to about 45° C., from about 22° C. to about 40° C., or from about 22° C. to about 28° C. Also, the phase change material according to some embodiments of the invention can have a latent heat that is at least about 40 J/g, such as, for example, at least about 50 J/g, at least about 60 J/g, at least about 70 J/g, at least about 80 J/g, at least about 90 J/g, or at least about 100 J/g. In one embodiment useful for clothing applications, the phase change material will have a latent heat ranging from about 40 J/g to about 400 J/g, such as, for example, from about 60 J/g to about 400 J/g, from about 80 J/g to about 400 J/g, or from about 100 J/g to about 400 J/g.

According to some embodiments of the invention, particularly useful phase change materials include paraffinic hydrocarbons having from 10 to 44 carbon atoms (i.e., $C_{10}$-$C_{44}$ paraffinic hydrocarbons). Table 1 provides a list of $C_{13}$-$C_{28}$ paraffinic hydrocarbons that can be used as phase chance materials in the multi-component fibers described herein. The number of carbon atoms of a paraffinic hydrocarbon typically correlates with its melting point. For example, n-Octacosane, which includes 28 straight chain carbon atoms per molecule, has a melting point of 61.4° C. By comparison, n-Tridecane, which includes 13 straight chain carbon atoms per molecule, has a melting point of −5.5° C. According to an embodiment of the invention, n-Octadecane, which includes 18 straight chain carbon atoms per molecule and has a melting point of 28.2° C., is particularly desirable for clothing applications.

TABLE 1

| Paraffinic Hydrocarbon | No. of Carbon Atoms | Melting Point (° C.) |
|---|---|---|
| n-Octacosane | 28 | 61.4 |
| n-Heptacosane | 27 | 59.0 |
| n-Hexacosane | 26 | 56.4 |
| n-Pentacosane | 25 | 53.7 |
| n-Tetracosane | 24 | 50.9 |
| n-Tricosane | 23 | 47.6 |
| n-Docosane | 22 | 44.4 |
| n-Heneicosane | 21 | 40.5 |
| n-Eicosane | 20 | 36.8 |
| n-Nonadecane | 19 | 32.1 |
| n-Octadecane | 18 | 28.2 |
| n-Heptadecane | 17 | 22.0 |
| n-Hexadecane | 16 | 18.2 |
| n-Pentadecane | 15 | 10.0 |
| n-Tetradecane | 14 | 5.9 |
| n-Tridecane | 13 | −5.5 |

Other useful phase change materials include polymeric phase change materials having transition temperatures suitable for a desired application of a multi-component fiber (e.g., from about 22° C. to about 40° C. for clothing applications). A polymeric phase change material can include a polymer (or a mixture of polymers) having a variety of chain structures that include one or more types of monomer units. In particular, polymeric phase change materials can include linear polymers branched polymers (e.g., star branched polymers, comb branched polymers, or dendritic branched polymers), or mixtures thereof. For certain applications, a polymeric phase change material desirably includes a linear polymer or a polymer with a small amount of branching to allow for a greater density and a greater degree of ordered molecular packing and crystallization. Such greater degree of ordered molecular packing and crystallization can lead to a larger latent heat and a narrower temperature stabilizing range (e.g., a well-defined transition temperature). A polymeric phase change material can include a homopolymer, a copolymer (e.g., terpolymer, statistical copolymer, random copolymer, alternating copolymer, periodic copolymer, block copolymer, radial copolymer, or graft copolymer), or a mixture thereof. Properties of one or more types of monomer units forming a polymeric phase change material can affect a transition temperature of the polymeric phase change material. Accordingly, the selection of the monomer units can be dependent upon a desired transition temperature or a desired application of multi-component fibers that include the polymeric phase change material. As one of ordinary skill in the art will understand, the reactivity and functionality of a polymer can be altered by addition of a functional group, such as, for example, amine, amide, carboxyl, hydroxyl, ester, ether, epoxide, anhydride, isocyanate, silane, ketone, and aldehyde. Also, a polymeric phase change material can include a polymer capable of crosslinking, entanglement, or hydrogen bonding in order to increase its toughness or its resistance to heat, moisture, or chemicals.

As one of ordinary skill in the art will understand, some polymers can be provided in various forms having different molecular weights, since a molecular weight of a polymer can be determined by processing conditions used for forming the polymer. Accordingly, a polymeric phase change material can include a polymer (or a mixture of polymers) having a particular molecular weight or a particular range of molecular weights. As used herein, the term "molecular weight" can refer to a number average molecular weight, a weight average molecular weight, or a melt index of a polymer (or a mixture of polymers).

According to some embodiments of the invention, a polymeric phase change material can be desirable as a result of having a higher molecular weight, a larger molecular size, or a higher viscosity relative to non-polymeric phase change materials (e.g., paraffinic hydrocarbons). As a result of this larger molecular size or higher viscosity, a polymeric phase change material can exhibit a lesser tendency to leak from a multi-component fiber during processing or during end use. For some embodiments of the invention, a polymeric phase change material can include polymers having a number average molecular weight ranging from about 400 to about 5,000, 000, such as, for example, from about 2,000 to about 5,000, 000, from about 8,000 to about 100,000, or from about 8,000 to about 15,000. When incorporated within a core/sheath fiber or an island-in-sea fiber, for example, its larger molecular size or its higher viscosity can prevent a polymeric phase change material from flowing through a sheath member or a sea member forming the exterior of the fiber. In addition to providing thermal regulating properties, a polymeric phase change material can provide improved mechanical properties (e.g., ductility, tensile strength, and hardness) when incorporated in multi-component fibers in accordance with various embodiments of the invention. If desired, a polymeric phase change material having a desired transition temperature can be combined with a polymeric material to form an elongated member. According to some embodiments of the invention, a polymeric phase change material can provide adequate mechanical properties such that it can be used to form an elongated member without requiring a polymeric material, thus allowing for a higher loading level of the polymeric phase change material and improved thermal regulating properties.

For example, polyethylene glycols can be used as a phase change material in some embodiments of the invention. The number average molecular weight of polyethylene glycol typically correlates with its melting point. For example, polyethylene glycols having a number average molecular weight in the range of about 570 to about 630 (e.g., Carbowax™ 600, available from The Dow Chemical Company, Midland, Mich.) typically will have a melting point of about 20° C. to about 25° C., making them desirable for clothing applications. Other polyethylene glycols that can be useful at other temperature stabilizing ranges include polyethylene glycols having a number average molecular weight of about 400 and a melting point in the range of about 4° C. to about 8° C., polyethylene glycols having a number average molecular weight in the range of about 1,000 to about 1,500 and a melting point in the range of about 42° C. to about 48° C., and polyethylene glycols having a number average molecular weight of about 6,000 and a melting point in the range of about 56° C. to about 63° C. (e.g., Carbowax™ 400, 1500 and 6000, available from The Dow Chemical Company Midland, Mich.).

Additional useful phase change materials include polymeric phase change materials based on polyethylene glycols that are endcapped with fatty acids. For example, polytetramethylene glycol fatty acid diesters having a melting point in the range of about 22° C. to about 35° C. can be formed from polyethylene glycols having a number average molecular weight in the range of about 400 to about 600 that are endcapped with stearic acid or lauric acid. Further useful phase change materials include polymeric phase change materials based on tetramethylene glycol. For example, polytetramethylene glycols having a number average molecular weight in the range of about 1,000 to about 1,800 (e.g., Terathane® 1000 and 1800, available from DuPont Inc., Wilmington, Del.) typically have a melting point in the range of about 19° C. to about 36° C. Polyethylene oxides having a melting point in the range of about 60° C. to about 65° C. also can be used as phase change materials in some embodiments of the invention.

For certain applications, polymeric phase change materials can include homopolymers having a melting point in the range of about 0° C. to about 50° C. that can be formed using conventional polymerization processes. Table 2 sets forth melting points of various homopolymers that can be formed from different types of monomer units.

TABLE 2

| Class of Monomer Unit | Homopolymer | Melting Point of Homopolymer (° C.) |
|---|---|---|
| Acrylates, Methacrylates, and Acrylamides | Polyoctadecyl methacrylate | 36 |
| | Polyhexadecyl methacrylate | 22 |
| | Poly-N-tetradecyl polyacrylamide | 18 |
| | Poly-N-tetradecyl polyacrylamide-1,1 dihydroperfluoro | 32-35 |
| Alkanes and Alkenes | Poly-1-decene | 34-40 |
| | Poly-1-heptene | 17 |
| | cis-polyoctenamer (Vestenamer® 6213, available from Degussa AG, Frankfurt, Germany) | 38 |
| | Poly-1-octene | 5-10 |
| | Poly-1-nonene | 19-22 |
| | trans-polypentemer | 23-34 |
| | Poly-1-undecene | 36 |
| | cis-polyisoprene | 28-36 |

TABLE 2-continued

| Class of Monomer Unit | Homopolymer | Melting Point of Homopolymer (° C.) |
|---|---|---|
| | syndiotactic 1,2-poly(1,3-pentadiene) | 10 |
| Ethers | 1-methyl-polydodecamethylene | 30 |
| | Polymethyleneoxytetramethylene oxide (Poly-1,3-dioxepane) | 30 |
| | Polyhexamethyleneoxymethylene oxide | 38 |
| | Polyoxacyclobutane (POX) | 34-36 |
| | n-octadecyl polyacetaldehyde | 18 |
| | Polytetramethylene glycol 1000 (Terathane® polyTHF 1000, available from DuPont Inc., Wilmington, Delaware) | 25-33 |
| | Polytetramethylene glycol 1400 (Terathane® polyTHF 1400, available from DuPont Inc., Wilmington, Delaware) | 27-35 |
| | Polytetramethylene glycol 1800 (Terathane® polyTHF 1800, available from DuPont Inc., Wilmington, Delaware) | 27-38 |
| | Polytetramethylene glycol 2000 (Terathane® polyTHF 2000, available from DuPont Inc., Wilmington, Delaware | 28-40 |
| Vinyls | Polydodecyl vinyl ether | 30 |
| | Polyvinyl laurate | 16 |
| | Polyvinyl myristate | 28 |
| Sulfur Containing Compounds | 3,3-dimethyl-polytrimethylene sulfide | 19 |
| | Polymethylene sulfide | 35 |
| | Polytetramethylene disulfide | 39-44 |
| | Polysulfur trioxide | 32 |
| | 1-methyl-trimethylene-poly-sulfonyldivalerate | 35 |
| Silicon Containing Compounds | beta-2-polydiethyl siloxane | 17 |
| | Nonamethylene-poly-disiloxanylene dipropionamide-diethyl, dimethyl (Si) | 10 |
| | Nonamethylene-poly-disiloxanylene dipropionamide-tetraethyl (Si) | 10 |
| | Polymethyl hexadecyl siloxane | 35 |
| Amides and Nitrogen Containing Compounds | Poly-(hexamethylene)cyclopropylene dicarboxamide-cis-N,N'-dibutyl | 20 |
| | Poly-(hexamethylene)cyclopropylene dicarboxamide-cis-N,N'-diethyl | 5 |
| | Poly-(hexamethylene)cyclopropylene dicarboxamide-cis-N,N'-diisopropyl | 20 |
| | Poly-(hexamethylene)cyclopropylene dicarboxamide-cis-N,N'-dimethyl | 30 |
| | Polypentamethylene adipamide-2,2,3,3,4,4 hexafluoro (diamine)-cis-N,N'-dibutyl | 15 |
| | Polypentamethylene adipamide-2,2,3,3,4,4 hexafluoro (diamine)-cis-N,N'-diethyl | 20 |
| | Polypentamethylene adipamide-2,2,3,3,4,4 hexafluoro (diamine)-cis-N,N'-diisopropyl | 35 |
| | Polypentamethylene adipamide-2,2,3,3,4,4 hexafluoro (diamine)-cis-N,N'-dimethyl | 30 |
| | Poly-(4,4'-methylene diphenylene sebacamide)-N,N'-diethyl | 32 |
| | Polypentamethylene (hexamethylene disulfonyl)-dicaproamide | 25 |
| Esters | Poly-[ethylene 4,4'-oxydimethylene-di-2-(1,3-dioxolane)-caprylate] | 19 |
| | Polypentamethylene adipate-2,2,3,3,4,4 hexa fluoro | 34 |
| | (4-methyl-(R+)-7-polyhydroxyenanthic acid) | 36 |
| | Poly-[4-hydroxy tetramethylene-2-(1,3-dioxolane) caprylic acid] | 23 |

TABLE 2-continued

| Class of Monomer Unit | Homopolymer | Melting Point of Homopolymer (° C.) |
|---|---|---|
| | (cis or trans) Polypentamethylene 2,2'-dibenzoate | 13 |
| | Polytetramethylene 2,2'-dibenzoate | 36 |
| | Poly-1-methyl-trimethylene 2,2' dibenzoate | 38 |
| | Polycaprolactone glycol (Molecular weight = 830) | 35-45 |

Further desirable phase change materials include polyesters having a melting point in the range of about 0° C. to about 40° C. that can be formed, for example, by polycondensation of glycols (or their derivatives) with diacids (or their derivatives). Table 3 sets forth melting points of polyesters that can be formed with various combinations of glycols and diacids.

TABLE 3

| Glycol | Diacid | Melting Point of Polyester (° C.) |
|---|---|---|
| Ethylene glycol | Carbonic | 39 |
| Ethylene glycol | Pimelic | 25 |
| Ethylene glycol | Diglycolic | 17-20 |
| Ethylene glycol | Thiodivaleric | 25-28 |
| 1,2-Propylene glycol | Diglycolic | 17 |
| Propylene glycol | Malonic | 33 |
| Propylene glycol | Glutaric | 35-39 |
| Propylene glycol | Diglycolic | 29-32 |
| Propylene glycol | Pimelic | 37 |
| 1,3-butanediol | Sulphenyl divaleric | 32 |
| 1,3-butanediol | Diphenic | 36 |
| 1,3-butanediol | Diphenyl methane-m,m'-diacid | 38 |
| 1,3-butanediol | trans-H,H-terephthalic acid | 18 |
| Butanediol | Glutaric | 36-38 |
| Butanediol | Pimelic | 38-41 |
| Butanediol | Azelaic | 37-39 |
| Butanediol | Thiodivaleric | 37 |
| Butanediol | Phthalic | 17 |
| Butanediol | Diphenic | 34 |
| Neopentyl glycol | Adipic | 37 |
| Neopentyl glycol | Suberic | 17 |
| Neopentyl glycol | Sebacic | 26 |
| Pentanediol | Succinic | 32 |
| Pentanediol | Glutaric | 22 |
| Pentanediol | Adipic | 36 |
| Pentanediol | Pimelic | 39 |
| Pentanediol | para-phenyl diacetic acid | 33 |
| Pentanediol | Diglycolic | 33 |
| Hexanediol | Glutaric | 28-34 |
| Hexanediol | 4-Octenedioate | 20 |
| Heptanediol | Oxalic | 31 |
| Octanediol | 4-Octenedioate | 39 |
| Nonanediol | meta-phenylene diglycolic | 35 |
| Decanediol | Malonic | 29-34 |
| Decanediol | Isophthalic | 34-36 |
| Decanediol | meso-tartaric | 33 |
| Diethylene glycol | Oxalic | 10 |
| Diethylene glycol | Suberic | 28-35 |
| Diethylene glycol | Sebacic | 36-44 |
| Diethylene glycol | Phthalic | 11 |
| Diethylene glycol | trans-H,H-terephthalic acid | 25 |
| Triethylene glycol | Sebacic | 28 |
| Triethylene glycol | Sulphonyl divaleric | 24 |
| Triethylene glycol | Phthalic | 10 |
| Triethylene glycol | Diphenic | 38 |
| para-dihydroxy-methyl benzene | Malonic | 36 |
| meta-dihydroxy-methyl benzene | Sebacic | 27 |
| meta-dihydroxy-methyl benzene | Diglycolic | 35 |

According to some embodiments of the invention, a polymeric phase change material having a desired transition temperature can be formed by reacting a phase change material (e.g., a phase change material discussed above) with a polymer (or a mixture of polymers). Thus, for example, n-octadecylic acid (i.e., stearic acid) can be reacted or esterified with polyvinyl alcohol to yield polyvinyl stearate, or dodecanoic acid (i.e., lauric acid) can be reacted or esterified with polyvinyl alcohol to yield polyvinyl laurate. Various combinations of phase change materials (e.g., phase change materials with one or more functional groups such as amine, carboxyl, hydroxyl, epoxy, silane, sulfuric, and so forth) and polymers can be reacted to yield polymeric phase change materials having desired transition temperatures.

Polymeric phase change materials having desired transition temperatures can be formed from various types of monomer units. For example, similar to polyoctadecyl methacrylate, a polymeric phase change material can be formed by polymerizing octadecyl methacrylate, which can be formed by esterification of octadecyl alcohol with methacrylic acid. Also, polymeric phase change materials can be formed by polymerizing a polymer (or a mixture of polymers). For example, poly-(polyethylene glycol)methacrylate, poly-(polyethylene glycol)acrylate, poly-(polytetramethylene glycol)methacrylate, and poly-(polytetramethylene glycol)acrylate can be formed by polymerizing polyethylene glycol methacrylate, polyethylene glycol acrylate, polytetramethylene glycol methacrylate, and polytetramethylene glycol acrylate, respectively. In this example, the monomer units can be formed by esterification of polyethylene glycol (or polytetramethylene glycol) with methacrylic acid (or acrylic acid). It is contemplated that polyglycols can be esterified with allyl alcohol or trans-esterified with vinyl acetate to form polyglycol vinyl ethers, which in turn can be polymerized to form poly-(polyglycol)vinyl ethers. In a similar manner, it is contemplated that polymeric phase change materials can be formed from homologues of polyglycols, such as, for example, ester or ether endcapped polyethylene glycols and polytetramethylene glycols.

According to some embodiments of the invention, a temperature regulating material can include a phase change material in a raw form (e.g., the phase change material is non-encapsulated, i.e., not micro- or macroencapsulated). During manufacture of a multi-component fiber, the phase change material in the raw form can be provided as a solid in a variety of forms (e.g., bulk form, powders, pellets, granules, flakes, and so forth) or as a liquid in a variety of forms (e.g., molten form, dissolved in a solvent, and so forth).

According to other embodiments of the invention, a temperature regulating material can include a containment structure that encapsulates, contains, surrounds, absorbs, or reacts with a phase change material. This containment structure can facilitate handling of the phase change material while offering a degree of protection to the phase change material during manufacture of a multi-component fiber or a product made therefrom (e.g., protection from high temperatures or shear forces). Moreover, the containment structure can serve to reduce or prevent leakage of the phase change material from the multi-component fiber during use. According to some embodiments of the invention, use of the containment structure can be desirable, but not required, when a first elongated member having the phase change material dispersed therein is not completely surrounded by a second elongated member.

For example, a temperature regulating material can include a set of microcapsules that contain a phase change material, and the microcapsules can be uniformly, or non-uniformly, dispersed within at least one elongated member. The microcapsules can be formed as shells enclosing the phase change material and can include individual microcapsules formed in a variety regular or irregular shapes (e.g., spherical, ellipsoidal, and so forth) and sizes. The individual microcapsules can have the same or different shapes or sizes. According to some embodiments of the invention, the microcapsules can have a maximum linear dimension (e.g., diameter) ranging from about 0.01 to about 100 microns. In one preferred embodiment, the microcapsules will have a generally spherical shape and will have a maximum linear dimension (e.g., diameter) ranging from about 0.5 to about 10 microns, such as, for example, from about 0.5 to about 3 microns. Other examples of a containment structure include silica particles (e.g., precipitated silica particles, fumed silica particles, and mixtures thereof), zeolite particles, carbon particles (e.g., graphite particles, activated carbon particles, and mixtures thereof), and absorbent materials (e.g., absorbent polymeric materials, superabsorbent materials, cellulosic materials, poly(meth)acrylate materials, metal salts of poly(meth)acrylate materials, and mixtures thereof). For example, a temperature regulating material can include silica particles, zeolite particles, carbon particles, or an absorbent material impregnated with a phase change material.

According to some embodiments of the invention, one or more elongated members can each include up to about 100 percent by weight of a temperature regulating material. Typically, an elongated member can include up to about 90 percent by weight of a temperature regulating material (e.g., up to about 50 percent or up to about 25 percent by weight of the temperature regulating material. In some preferred embodiments, an elongated member can include from about 5 percent to about 70 percent by weight of a temperature regulating material. Thus, in one embodiment, an elongated member can include from about 5 percent to about 60 percent by weight of a temperature regulating material, and, in other embodiments, the elongated member can include from about 10 percent to about 30 percent or from about 15 percent to about 25 percent by weight of the temperature regulating material.

As discussed previously, a multi-component fiber according to some embodiments of the invention can include a set of elongated members. The elongated members can be formed from the same or different polymeric materials. According to some embodiments of the invention, the elongated members can include a first elongated member (or a first set of elongated members) formed from a first polymeric material that has a temperature regulating material dispersed therein. In addition, the elongated members can include a second elongated member (or a second set of elongated members) formed from a second polymeric material that can differ in some fashion from the first polymeric material. It should be recognized that the elongated members can be formed from the same polymeric material, in which case the first and second polymeric materials will be the same. According to some embodiments of the invention, the temperature regulating material can include a polymeric phase change material that provides adequate mechanical properties such that it can be used to form the first elongated member (or the first set of elongated members) without requiring the first polymeric material. According to other embodiments of the invention, the temperature regulating material can include a polymeric phase change material that can be reacted or blended with the first polymeric material to form the first elongated member (or the first set of elongated members). For example, polyoctadecyl methacrylate can be blended with polypropylene for a melt spinning process. As another example, polyvinyl laurate can be graft reacted onto a polyacrylic backbone for a solution spinning process. As a further example, polyvinyl stearate can be blended with polyacrylics for a solution spinning process.

In general, a polymeric material (e.g., the first polymeric material or the second polymeric material) can include any polymer (or mixture of polymers) that has the capability of being formed into an elongated member. According to some embodiments of the invention, an elongated member can be formed from any fiber-forming polymer (or mixture of fiber-forming polymers). According to embodiments of the invention wherein a melt spinning process is used to form a multi-component fiber, a polymeric material can include a thermoplastic polymer (or a mixture of thermoplastic polymers) (i.e., one that can be heated to form a melt and subsequently shaped or molded to form an elongated member). According to other embodiments of the invention, a polymeric material can include an elastomeric polymer (or a mixture of elastomeric polymers).

A polymeric material can include a polymer (or a mixture of polymers) having a variety of chain structures that include one or more types of monomer units. In particular, a polymeric material can include a linear polymer, a branched polymer (e.g., star branched polymer, comb branched polymer, or dendritic branched polymer), or a mixture thereof. A polymeric material can include a homopolymer, a copolymer (e.g., terpolymer, statistical copolymer, random copolymer, alternating copolymer, periodic copolymer, block copolymer, radial copolymer, or graft copolymer), or a mixture thereof. As one of ordinary skill in the art will understand, the reactivity and functionality of a polymer can be altered by addition of a functional group, such as, for example, amine, amide, carboxyl, hydroxyl, ester, ether, epoxide, anhydride, isocyanate, silane, ketone, and aldehyde. Also, a polymeric material can include a polymer that is capable of crosslinking, entanglement, or hydrogen bonding in order to increase its toughness or its resistance to heat, moisture, or chemicals.

Examples of polymers that can be used to form an elongated member according to various embodiments of the invention include polyamides (e.g., Nylon 6, Nylon 6/6, Nylon 12, polyaspartic acid, polyglutamic acid, and so forth), polyamines, polyimides, polyacrylics (e.g., polyacrylamide, polyacrylonitrile, esters of methacrylic acid and acrylic acid, and so forth), polycarbonates (e.g., polybisphenol A carbonate, polypropylene carbonate, and so forth), polydienes (e.g., polybutadiene, polyisoprene, polynorbornene, and so forth), polyepoxides, polyesters (e.g., polyethylene terephthalate, polybutylene terephthalate, polytrimethylene terephthalate, polycaprolactone, polyglycolide, polylactide, polyhydroxybutyrate, polyhydroxyvalerate, polyethylene adipate, polybutylene adipate, polypropylene succinate, and so forth), polyethers (e.g., polyethylene glycol (polyethylene oxide), polybutylene glycol, polypropylene oxide, polyoxymethylene (paraformaldehyde), polytetramethylene ether (polvetrahydrofuran), polyepichlorohydrin, and so forth), polyfluorocarbons, formaldehyde polymers (e.g., urea-formaldehyde, melamine-formaldehyde, phenol formaldehyde, and so forth), natural polymers (e.g., cellulosics, chitosans, lignins, waxes, and so forth), polyolefins (e.g., polyethylene, polypropylene, polybutylene, polybutene, polyoctene, and so forth), polyphenylenes (e.g., polyphenylene oxide, polyphenylene sulfide, polyphenylene ether sulfone, and so forth), silicon containing polymers (e.g., polydimethyl siloxane, polycarbomethyl silane, and so forth), polyurethanes, polyvinyls (e.g., polyvinyl butyral, polyvinyl alcohol, esters and ethers of polyvinyl alcohol, polyvinyl acetate, polystyrene, polymethylstyrene, polyvinyl chloride, polyvinyl pyrrolidone, polymethyl vinyl ether, polyethyl vinyl ether, polyvinyl methyl ketone, and so forth), polyacetals, polyarylates, and copolymers (e.g., polyethylene-co-vinyl acetate, polyethylene-co-acrylic acid, polybutylene terephthalate-co-polyethylene terephthalate, polylauryllactam-block-polytetrahydrofuran, and so forth).

According to some embodiments of the invention, a first polymeric material can include a polymer (or a mixture of polymers) that facilitates dispersing or incorporating a temperature regulating material within a first elongated member (or a first set of elongated members). According to some embodiments of the invention, the first polymeric material can include a polymer (or a mixture of polymers) that is compatible or miscible with or has an affinity for the temperature regulating material. In some embodiments of the invention, this affinity can depend on, by way of example and not by limitation, similarity of solubility parameters, polarities, hydrophobic characteristics, or hydrophilic characteristics of the first polymeric material and the temperature regulating material. Such affinity can facilitate dispersion of the temperature regulating material in an intermediate molten or liquid form of the first polymeric material during manufacture of a multi-component fiber and, thus, ultimately can facilitate incorporation of more uniform or greater amounts or loading level of a phase change material in the multi-component fiber. In embodiments where the temperature regulating material further includes a containment structure, the first polymeric material can include a polymer (or a mixture of polymers) selected for its affinity for the containment structure in conjunction with, or as an alternative to, its affinity for the phase change material. For example, if the temperature regulating material includes a set of microcapsules containing the phase change material, a polymer (or a mixture of polymers) can be selected having an affinity for the microcapsules (e.g., for a material or materials of which the microcapsules are formed). For example, some embodiments of the invention can select the first polymeric material to include the same or a similar polymer as a polymer forming the microcapsules (e.g., if the microcapsules include nylon shells, the first polymeric material can be selected to include nylon). Such affinity can facilitate dispersion of the microcapsules containing the phase change material in an intermediate molten or liquid form of the first polymeric material and, thus, ultimately can facilitate incorporation of more uniform or greater amounts or loading level of the phase change material in the multi-component fiber. In one preferred embodiment of the invention, the first polymeric material can be selected to be sufficiently non-reactive with the temperature regulating material so that a desired temperature stabilizing range is maintained when the temperature regulating material is dispersed within the first polymeric material.

For example, the first polymeric material can include high-density polyethylenes having a melt index in the range of about 4 to about 36 g/10 min (e.g., high-density polyethylenes having melt indices of 4, 12, and 36 g/10 min, available from Sigma-Aldrich Corp., St. Louis, Mo.), modified forms of high-density polyethylenes (e.g., Fusabond® E MB100D, available from DuPont Inc., Wilmington, Del.), and modified forms of ethylene propylene rubber (e.g., Fusabond® N MF416D, available from DuPont Inc., Wilmington, Del.). As one of ordinary skill in the art will understand, a melt index typically refers to a measure of the flow characteristics of a polymer (or a mixture of polymers) and inversely correlates with a molecular weight of the polymer (or the mixture of polymers). For polar phase change materials (e.g., polyethylene glycols, polytetramethylene glycols, and their homologues), the first polymeric material can include a polar polymer (or a mixture of polar polymers) to facilitate dispersion of the polar phase change materials. Thus, for example, the first polymeric material can include copolymers of polyesters, such as, for example, polybutylene terephthalate-block-polytetramethylene glycols (e.g., Hytrel® 3078, 5544, and 8238, available from DuPont Inc., Wilmington, Del.), and copolymers of polyamides, such as, for example, polyamide-block-polyethers (e.g., Pebax® 2533, 4033, 5533, 7033, MX 1205, and MH 1657, available from ATOFINA Chemicals, Inc., Philadelphia, Pa.).

According to some embodiments of the invention, a first polymeric material can include a polymer (or a mixture of polymers) that has a slight or partial compatibility or miscibility with or affinity for a temperature regulating material (e.g., a semi-miscible polymer). Such partial affinity can be adequate to facilitate dispersion of the temperature regulating material and to facilitate processing at higher temperatures and during a melt spinning process. At lower temperatures and shear conditions and once a multi-component fiber has been formed, this partial affinity can allow the temperature regulating material to separate out. For embodiments of the invention wherein a phase change material in a raw form is used, this partial affinity can lead to insolubilization of the phase change material and increased phase change material domain formation within the multi-component fiber. According to some embodiments of the invention, domain formation can lead to an improved thermal regulating property by facilitating transition of the phase change material between two states. In addition, domain formation can serve to reduce or prevent loss or leakage of the phase change material from the multi-component fiber during processing or during use.

For example, certain phase change materials such as paraffinic hydrocarbons can be compatible with polyolefins or copolymers of polyolefins at lower concentrations of the phase change materials or when the temperature is above a critical solution temperature. Thus, for example, mixing of a paraffinic hydrocarbon (or a mixture of paraffinic hydrocarbons) and polyethylene or polyethylene-co-vinyl acetate can be achieved at higher temperatures and higher concentrations of the paraffinic hydrocarbon to produce a homogenous blend that can be easily controlled, pumped, and processed in a melt spinning process. Once a multi-component fiber has been formed and has cooled, the paraffinic hydrocarbon can become insoluble and can separate out into distinct domains. These domains can allow for pure melting or crystallization of the paraffinic hydrocarbon for an improved thermal regulating property. In addition, these domains can serve to reduce or prevent loss or leakage of the paraffinic hydrocarbon. According to some embodiments of the invention, the polyethylene-co-vinyl acetate can have between about 5 and about 90 percent by weight of the vinyl acetate, and, according to other embodiments of the invention, the vinyl acetate content is between about 5 and about 50 percent by weight. In one preferred embodiment, the vinyl acetate content is desirably between about 18 to about 25 percent by weight. This content of the vinyl acetate can allow for temperature miscibility control when mixing the paraffinic hydrocarbon and the polyethylene-co-vinyl acetate to form a blend. In particular, this vinyl acetate content can allow for excellent miscibility at higher temperatures, thus facilitating melt spinning process stability and control due to homogeneity of the blend. At lower temperatures (e.g., room temperature or normal commercial fabric use temperatures), the polyethylene-co-vinyl acetate is semi-miscible with the paraffinic hydrocarbon thus allowing for separation and micro-domain formation of the paraffinic hydrocarbon.

A first polymeric material can serve as a carrier for a temperature regulating material as a multi-component fiber is being formed in accordance with some embodiments of the invention. In addition, the first polymeric material can facilitate maintaining integrity of a first elongated member (or a first set of elongated members) during fiber processing and can provide enhanced mechanical properties to the resulting multi-component fiber.

According to an embodiment of the invention, a first polymeric material can include a low molecular weight polymer (or a mixture of low molecular weight polymers). A low molecular weight polymer typically has a low viscosity when heated to form a melt, which low viscosity can facilitate dispersion of a temperature regulating material in the melt. As discussed previously, some polymers can be provided in a variety of forms having different molecular weights. Accordingly, as used herein, the term "low molecular weight polymer" can refer to a low molecular weight form of a polymer (e.g., a low molecular weight form of a polymer discussed previously). For example, a polyethylene having a number average molecular weight of about 20,000 (or less) can be used as the low molecular weight polymer in an embodiment of the invention. It should be recognized that a molecular weight or a range of molecular weights associated with a low molecular weight polymer can depend on the particular polymer selected (e.g., polyethylene) or on the method or equipment used to disperse the temperature regulating material in a melt of the low molecular weight polymer.

According to another embodiment of the invention, a first polymeric material can include a mixture of a low molecular weight polymer and a high molecular weight polymer. A high molecular weight polymer typically has enhanced physical properties (e.g., mechanical properties) but can have a high viscosity when heated to form a melt. As used herein, the term "high molecular weight polymer" can refer to a high molecular weight form of a polymer (e.g., a high molecular weight form of a polymer discussed previously). A low molecular weight polymer and a high molecular weight polymer can be selected to be compatible or miscible with or to have an affinity for one another. Such affinity can facilitate forming a mixture of the low molecular weight polymer, the high molecular weight polymer, and a temperature regulating material during manufacture of a multi-component fiber and, thus, can ultimately facilitate incorporation of more uniform or greater amounts or loading level of a phase change material in the multi-component fiber. According to some embodiments of the invention, the low molecular weight polymer serves as a compatibilizing link between the high molecular weight polymer and the temperature regulating material to thereby facilitate incorporating the temperature regulating material in the multi-component fiber.

According to some embodiments of the invention, an elongated member can typically include from about 10 percent to about 30 percent by weight of a temperature regulating material with the remaining portion of the elongated member including a low molecular weight polymer and a high molecular weight polymer. For example, in one preferred embodiment, the elongated member can include 15 percent by weight of the low molecular weight polymer, 70 percent by weight of the high molecular weight polymer, and 15 percent by weight of the temperature regulating material.

According to some embodiments of the invention, a second polymeric material can include a polymer (or a mixture of polymers) that has or provides one or more desired physical properties for a multi-component fiber. Examples of desired physical properties include mechanical properties (e.g., ductility, tensile strength, and hardness), thermal properties (e.g., thermoformability), and chemical properties (e.g., reactivity). The second polymeric material can include a polymer (or a mixture of polymers) selected to compensate for any deficiencies (e.g., mechanical or thermal deficiencies) of a first polymeric material or of a first elongated member (or a first set of elongated members), such as due to a high loading level of a temperature regulating material. According to some embodiments of the invention, the second polymeric material operates to improve the multi-component fiber's overall physical properties (e.g., mechanical properties) and the multi-component fiber's processability (e.g., by facilitating its formation via a melt spinning process). The second polymeric material can serve to enclose the temperature regulating material included in the first elongated member (or the first set of elongated members). Accordingly, the second polymeric material can allow for the use of the first polymeric material or of the temperature regulating material that is not optimized for high temperature and high shear fiber processing. In addition, the second polymeric material can reduce or prevent loss or leakage of a phase change material during fiber processing or during end use. According to some embodiments of the invention, the second polymeric material can be sufficiently non-reactive with the temperature regulating material to maintain a desired temperature stabilizing range of the temperature regulating material.

According to an embodiment of the invention, a second polymeric material can include a high molecular weight polymer. As discussed previously, a high molecular weight polymer typically has enhanced physical properties (e.g., mechanical properties) and can be selected to be a high molecular weight form of a polymer (e.g., a high molecular weight form of a polymer discussed previously).

According to some preferred embodiments of the invention, a second polymeric material can include a polyester due, in part, to its excellent processability, properties imparted to a resulting fiber, and its resistance to certain phase change materials, such as paraffinic hydrocarbons, to reduce or prevent loss or leakage of these phase change materials. According to an embodiment of the invention, the polyester can have a number average molecular weight of about 20,000 (or more). According to other embodiments of the invention, the second polymeric material can include a polyolefin, such as a polypropylene having a melt index in the range of about 8 to about 1,500 g/10 min, such as about 12 g/10 min, about 18 g/10 min, or about 30 g/10 min.

At this point, those of ordinary skill in the art can appreciate a number of advantages associated with various embodiments of the invention. For example, a multi-component fiber in accordance with various embodiments of the invention can provide improved thermal regulating properties, which allows for an improved level of comfort when the multi-component fiber is incorporated in products such as, for example, apparel or footwear. A multi-component fiber in accordance with various embodiments of the invention can include high loading levels of one or more phase change materials within a first elongated member (or a first set of elongated members). According to some embodiments of the invention, a high loading level can be provided because a second elongated member (or a second set of elongated members) surrounds the first elongated member (or the first set of elongated members). The second elongated member can include a polymer (or a mixture of polymers) selected to compensate for any deficiencies (e.g., mechanical or thermal deficiencies) associated with the first elongated member, such as due to the high loading level of the phase change material. Moreover, the second elongated member can include a polymer (or a mixture of polymers) selected to improve the fiber's overall physical properties (e.g., mechanical properties) and the fiber's processability (e.g., by facilitating its formation via a melt spinning process). By surrounding the first elongated member, the second elongated member can serve to enclose the phase change material within the multi-component fiber to reduce or prevent loss or leakage of the phase change material.

A multi-component fiber in accordance with various embodiments of the invention can have virtually any proportion of the fiber's total weight including a first elongated member (or a first set of elongated members) that includes a temperature regulating material relative to a second elongated member (or a second set of elongated members). By way of example and not by limitation, when a thermal regulating property of a multi-component fiber is a controlling consideration, a larger proportion of the multi-component fiber can include a first elongated member that includes a temperature regulating material. On the other hand, when the physical properties of the multi-component fiber (e.g., mechanical properties) are a controlling consideration, a larger proportion of the multi-component fiber can include a second elongated member that does not include the temperature regulating material. Alternatively, when balancing thermal regulating and physical properties of the multi-component fiber, it can be desirable that the second elongated member includes the same or a different temperature regulating material. Moreover, as discussed previously, it can be desirable that the multi-component fiber includes an insulation material, which can be contained within one or more internal cavities formed within the multi-component fiber.

A multi-component fiber in accordance with some embodiments of the invention can include from about 1 percent up to about 99 percent by weight of a first elongated member (or a first set of elongated members). Typically, a multi-component fiber according to an embodiment of the invention can include from about 10 percent to about 90 percent by weight of a first elongated member (or a first set of elongated members). For example, an embodiment of a core/sheath fiber can include 90 percent by weight of a core member and 10 percent by weight of a sheath member. For this embodiment, the core member can include 60 percent by weight of a temperature regulating material, such that the core/sheath fiber includes 54 percent by weight of the temperature regulating material. Another embodiment of the core/sheath fiber can include up to about 50 percent by weight of the core member, which in turn can include up to about 50 percent by weight of a temperature regulating material. Utilizing such weight percentages provides the core/sheath fiber with up to about 25 percent by weight of the temperature regulating material and provides effective thermal regulating and mechanical properties for the core/sheath fiber. It should be recognized that the percent by weight of an elongated member relative to a total weight of a multi-component fiber can be varied, for example, by adjusting a cross sectional area of the elongated member or by adjusting the extent to which the elongated member extends through the length of the multi-component fiber.

A multi-component fiber in accordance with some embodiments of the invention can have a latent heat that is at least about 2 J/g, such as, for example, at least about 5 J/g, at least about 8 J/g, at least about 11 J/g, or at least about 14 J/g. For example, a multi-component fiber according to an embodiment of the invention can have a latent heat ranging from about 2 J/g to about 20 J/g, such as, for example, from about 5 J/g to about 20 J/g, from about 8 J/g to about 20 J/g, from about 11 J/g to about 20 J/g, or from about 14 J/g to about 20 J/g.

Multi-component fibers in accordance with various embodiments of the invention can be manufactured using a variety of methods, such as, for example, using a melt spinning process or a solution spinning process (wet or dry). For either process, multi-component fibers can be formed by extruding materials through a set of orifices in a spinneret to form fibers that emerge from the orifices. As used herein, the term "spinneret" can refer to a portion of a fiber extrusion apparatus that delivers one or more polymeric materials and one or more temperature regulating materials through orifices for extrusion into an outside environment. A typical spinneret can include from 1 to 500,000 orifices per meter of length of the spinneret, such as, for example, from 1 to 5,000 orifices per meter of length of the spinneret. The spinneret can be implemented with holes drilled or etched through a plate or with any other structure capable of issuing desired fibers.

In a melt spinning process, one or more polymeric materials and one or more temperature regulating materials forming multi-component fibers can be delivered to orifices of a spinneret in a molten state. Prior to passing through the orifices, a temperature regulating material can be mixed with a first polymeric material to form a blend. As a result of mixing, the temperature regulating material can be dispersed within and at least partially enclosed by the first polymeric material. Portions of the temperature regulating material that are not enclosed by the first polymeric material can be enclosed by a second polymeric material upon emerging from the spinneret to reduce or prevent loss or leakage of the temperature regulating material from the resulting multi-component fibers. The blend and the second polymeric material can be combined and directed through each orifice in various configurations to form a first elongated member (or a first set of elongated members) and a second elongated member (or a second set of elongated members), respectively thus forming a multi-component fiber. For example, the blend can be directed through the orifices to form core members of core/sheath fibers or island members of island-in-sea fibers, and the second polymeric material can be directed through the orifices to form sheath members of core/sheath fibers or sea members of island-in-sea fibers. In some instances, the blend and the second polymeric material can be combined and directed through each orifice so as to form one or more internal cavities within a resulting multi-component fiber, which one or more internal cavities can contain an insulation material, such as air.

According to some embodiments of the invention, multi-component fibers can be formed using pellets including a first polymeric material and a temperature regulating material. The pellets can, for example, include a solidified melt mixture of the temperature regulating material, a low molecular weight polymer, and a high molecular weight polymer. According to other embodiments of the invention, the pellets can be formed from the first polymeric material, and the pellets can be impregnated or imbibed with a phase change material. The pellets can be melted to form a blend and processed along with a second polymeric material as discussed above to form multi-component fibers.

In a solution spinning process, one or more polymeric materials and one or more temperature regulating materials forming multi-component fibers can be dissolved in a solvent prior to passing through orifices of a spinneret. In a wet spinning process, the spinneret can be submerged in a chemical bath such that, upon exiting the spinneret, materials can precipitate from solution and form a solid fiber. In a dry spinning process, materials can emerge from the spinneret in air and solidify due to the solvent (e.g., acetone) evaporating in air.

For either process, it should be recognized that a first polymeric material need not be used for certain applications. For example, a temperature regulating material can include a polymeric phase change material having a desired transition temperature and providing adequate mechanical properties when incorporated in multi-component fibers. Thus, the temperature regulating material and a second polymeric material can be combined and directed through each orifice in various configurations to form a first elongated member (or a first set of elongated members) and a second elongated member (or a second set of elongated members), respectively. For example, the temperature regulating material can be directed through the orifices to form core members of core/sheath fibers or island members of island-in-sea fibers, and the second polymeric material can be directed through the orifices to form sheath members of core/sheath fibers or sea members of island-in-sea fibers.

After emerging from a spinneret, multi-component fibers can be drawn or stretched utilizing a godet or an aspirator. For example, multi-component fibers emerging from the spinneret in a melt spinning process can form a vertically oriented curtain of downwardly moving fibers that are at least partially quenched before entering a long, slot-shaped air aspirator positioned below the spinneret. The aspirator can introduce a rapid, downwardly moving air stream produced by compressed air from one or more air aspirating jets. The air stream can create a drawing force on the fibers, causing them to be drawn between the spinneret and the air jet and attenuating the fibers. As one of ordinary skill in the art will understand, a melt spinning process can be classified as a melt-blown process or a spunbond process depending on, for example, a temperature and a volume of air used to attenuate fibers and the location where the fibers are attenuated. Compared with a spunbond process, a melt-blown process typically uses a larger volume of air at a higher temperature to attenuate fibers. Also, compared with a spunbond process, a melt-blown process typically applies an attenuation force closer to a spinneret, such that polymeric materials forming the resulting fibers can still be solidifying.

Once formed, multi-component fibers can be further processed for numerous fiber applications. In particular, multi-component fibers can be subjected to, by way of example and not by limitation, woven, non-woven, knitting, or weaving processes to form various types of plaited, braided, twisted, felted, knitted, woven, or non-woven fabrics. For example, multi-component fibers can be wound on a bobbin or spun into a yarn and then utilized in various conventional knitting or weaving processes. As another example, multi-component fibers can be randomly laid on a forming surface (e.g., a moving conveyor screen belt such as a Fourdrinier wire) to form a continuous, non-woven web of fibers. According to an embodiment of the invention, multi-component fibers can be cut into short staple fibers prior to forming the web. One potential advantage of employing staple fibers is that a more isotropic non-woven web can be formed, since the staple fibers can be oriented in the web more randomly than longer or uncut fibers (e.g., continuous fibers). The web can then be bonded using any conventional bonding method to form a stable, non-woven fabric for use in manufacturing a variety of textiles. An example of a bonding method involves lifting the web from the moving screen belt and passing the web through two heated calender rolls. If desired, at least one of the rolls can be embossed to cause the web to be bonded in numerous spots. Air carded or spun-laid webs can also be formed from multi-component fibers according to some embodiments of the invention. As a further example, multi-component fibers formed in accordance with a melt-blown process can form an intermediate layer positioned between two layers of fibers formed in accordance with a spunbond process, thus forming a non-woven laminate of fibers. The fibers formed in accordance with the spunbond process can include larger denier fibers that are drawn and provide improved mechanical properties, while the fibers formed in accordance with the melt-blown process can include smaller denier fibers that are undrawn and provide improved coverage and thermal regulating properties. The non-woven laminate can then be bonded using any conventional bonding method to form a spunbond-melt-blown-spunbond ("SMS") fabric.

A fabric in accordance with some embodiments of the invention can have a latent heat that is at least about 2 J/g, such as, for example, at least about 5 J/g, at least about 8 J/g, at least about 11 J/g, or at least about 14 J/g. For example, a fabric according to an embodiment of the invention can have a latent heat ranging from about 2 J/g to about 20 J/g, such as, for example, from about 5 J/g to about 20 J/g, from about 8 J/g to about 20 J/g, from about 11 J/g to about 20 J/g, or from about 14 J/g to about 20 J/g.

It should be recognized that fabrics can be formed from multi-component fibers including two or more different temperature regulating materials. According to some embodiments of the invention, such combination of temperature regulating materials can exhibit two or more distinct transition temperatures. For example, a fabric for use in manufacturing a glove can be formed from multi-component fibers including phase change materials A and B. Phase change material A can have a melting point of about 5° C., and phase change material B can have a melting point of about 75° C. This combination of phase change materials in the multi-component fibers can provide the glove with enhanced thermal regulating properties in cold environments (e.g., outdoor use during winter conditions) as well as warm environments (e.g., when handling heated objects such as oven trays). In addition, fabrics can be formed from two or more types of multi-component fibers that differ in some fashion (e.g., formed with different configurations or including different temperature regulating materials). For example, a fabric can be formed from a certain percentage of core/sheath fibers including a first temperature regulating material and a remaining percentage of core/sheath fibers including a second temperature regulating material. This combination of core/sheath fibers can provide the fabric with enhanced thermal regulating properties in different environments (e.g., cold and warm).

Figure 6:
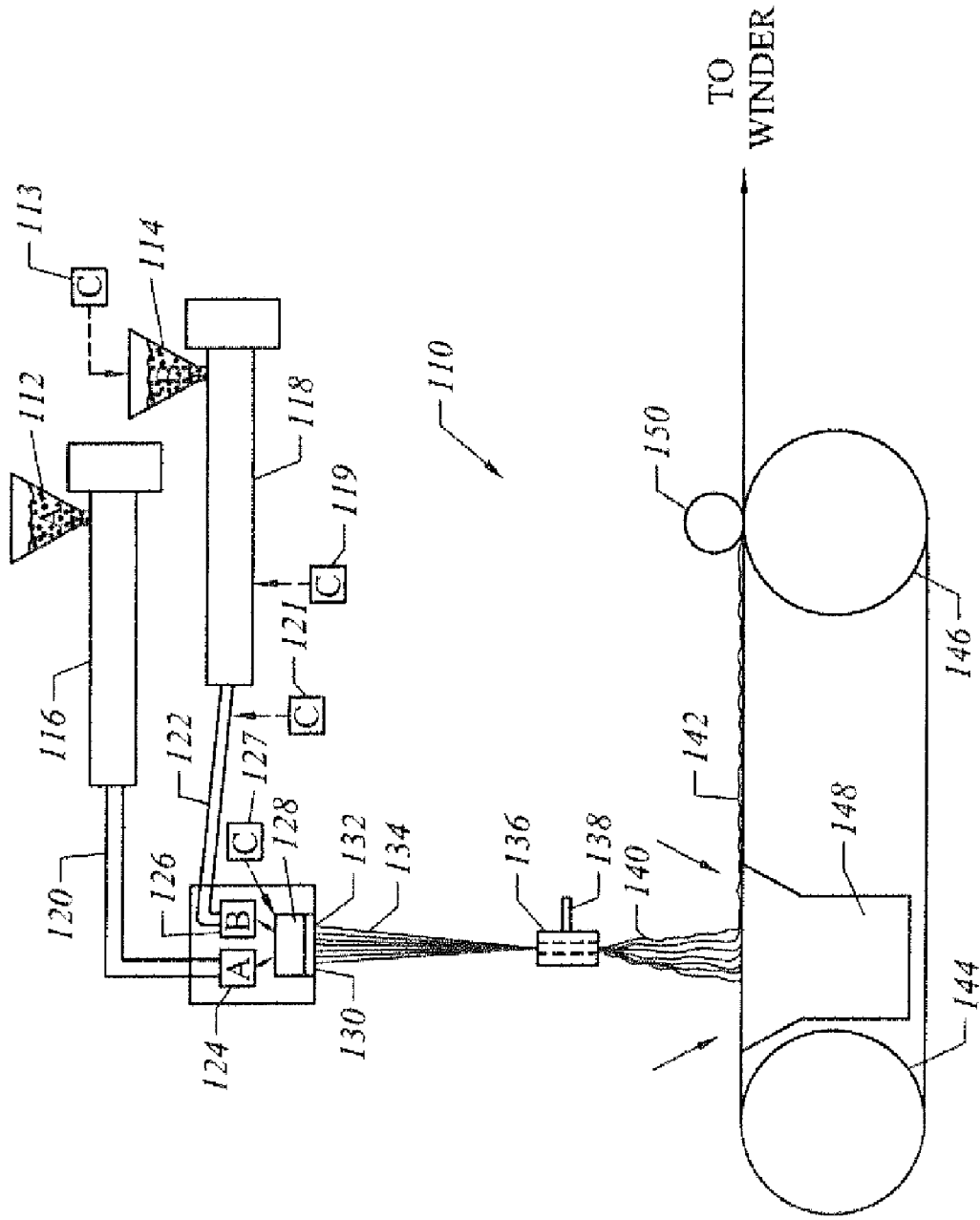
FIG. 6 illustrates a fiber extrusion apparatus for forming multi-component fibers in accordance with an embodiment of the invention.

Turning next to FIG. 6, a fiber extrusion apparatus 110 for forming multi-component fiber 134 in accordance with an embodiment of the invention is illustrated. The apparatus 110 can be used to form the multi-component fiber 134 via a melt spinning process. In addition, the apparatus 110 can be used to subject the formed multi-component fiber 134 to a spunbond process to produce a non-woven fabric having desired thermal regulating properties.

The apparatus 110 includes a spin pack 128 for extruding and forming the multi-component fibers 134. As used herein, the term "spin pack" can refer to an assembly for processing one or more polymeric materials and one or more temperature regulating materials to produce extruded fibers. According to some embodiments of the invention, a spin pack can include a filtration system, a distribution system, and a spinneret. Examples of spin packs are described in the patent of Hills, U.S. Pat. No. 5,162,074, entitled "Method of Making Plural Component Fibers" and references cited therein, the disclosures of which are incorporated herein by reference in their entirety. In the present embodiment, the spin pack 128 provides a flow path for two or more molten polymeric materials, and the multi-component fiber 134 can emerge from a spinneret 130 having one or more configurations (e.g., core-sheath or island-in-sea configurations).

As shown in FIG. 6, the apparatus 110 also includes hoppers 112 and 114 that receive a polymeric material A and a polymeric material B, respectively. The polymeric materials A and B can be provided in the form of a liquid or a solid (e.g., as pellets) and are respectively fed from the hoppers 112 and 114 into screw extruders 116 and 118. If initially provided in solid form, the polymeric materials A and B typically melt as they are conveyed towards heated pipes 120 and 122. A temperature regulating material C can be added to and mixed with the polymeric material B at one or more locations along the apparatus 110 to form a blend prior to encountering the polymeric material A at the spinneret 130. FIG. 6 shows various locations for adding the temperature regulating material C to the polymeric material B in the apparatus 110. For example, the temperature regulating material C can be added at location 113 to the hopper 114, at location 119 to the screw extruder 118, or at location 127 to the spin pack 128. It should be recognized that the temperature regulating material C can be added to the polymeric material B to form a blend, and this blend can be provided in the form of a liquid or a solid (e.g., as pellets) and then fed into the hopper 114. Alternatively, or in conjunction, the temperature regulating material C (or another temperature regulating material having somewhat different properties) can be added to and mixed with the polymeric material A at one or more locations along the apparatus 110 to form a blend. According to some embodiments of the invention, the temperature regulating material C can include a polymeric phase change material that provides adequate mechanical properties when incorporated in the multi-component fibers 134. For such embodiments of the invention, the polymeric material B can be omitted, and the temperature regulating material C can be simply added at location 113 to the hopper 114 and combined with the polymeric material A at the spinneret 130 to form the multi-component fibers 134.

In the embodiment of the invention shown in FIG. 6, mixing of the temperature regulating material C with the polymeric material B can be accomplished in either, or both, a static or dynamic fashion. Dynamic mixing can occur by any mechanical method that effectively agitates or mixes the temperature regulating material C with the polymeric material B to form the blend, such as, for example, by using the screw extruder 118. For example, when the temperature regulating material C is added to the hopper 114 or to the screw extruder 118, dynamic mixing occurs, and a liquid stream of the blend is moved within the screw extruder 118 towards the heated pipe 122.

In contrast to dynamic mixing, static mixing typically need not utilize any mechanical agitating or mixing methods. According to some embodiments of the invention, static mixing can be effected by intersecting pathways of two or more traveling liquid streams of different materials a sufficient number of times to achieve desired mixing. An example of a static mixer that can be used according to an embodiment of the invention is described in the patent of Haggard et al., U.S. Pat. No. 5,851,562, entitled "Instant Mixer Spin Pack," the disclosure of which is incorporated herein by reference in its entirety. Static mixing of the temperature regulating material C with the polymeric material B can occur within the spin pack 128 or at various other locations within the apparatus 110 prior to combining with the polymeric material A at the spinneret 130. For example, the temperature regulating material C can be added at location 121 and statically mixed with the polymeric material B as it travels within the heated pipe 122. In particular, a first liquid stream of the temperature regulating material C can be intersected with a second liquid stream of the polymeric material B to form the desired blend in a resulting liquid stream. If desired, the resulting liquid stream can be further subjected to either, or both, static or dynamic mixing prior to combining with the polymeric material A at the spinneret 130.

With reference to FIG. 6, liquid streams of the polymeric material A and the blend can respectively flow through the heated pipes 120 and 122 to metering pumps 124 and 126, which feed the two liquid streams to the spin pack 128. The spin pack 128 has suitable internal components capable of forming the multi-component fiber 134 having a desired configuration (e.g., a core-sheath or island-in-sea configuration). In the apparatus 110 of FIG. 6, the liquid streams are combined in the spin pack 128 such that the polymeric material A surrounds the blend. The spin pack 128 includes the spinneret 130 with orifices 132 that form the multi-component fiber 134 extruded therethrough. An array of the multi-component fibers 134 exit the spinneret 130 and are pulled downward and attenuated by an aspirator 136. The aspirator 136 is fed by compressed air or steam from pipe 138. The aspirator 136 can be, for example, of the gun type or of the slot type and, if desired, can extend across the full width of the fiber array, e.g., in the direction corresponding to the width of a web to be formed from the multi-component fibers 134.

It should be recognized that a set of separate blends can be formed, wherein each blend includes one or more temperature regulating materials and one or more polymeric materials. The separate blends can differ from one another in some fashion. For example, the separate blends can include different temperature regulating materials or different polymeric materials. Once formed, the separate blends can be combined with the polymeric material A in the spin pack 128 such that the polymeric material A surrounds the set of separate blends. The separate blends and the polymeric material A can then be extruded from the spinneret 130 so as to form multi-component fibers having a desired configuration (e.g., an island-in-sea configuration). According to an embodiment of the invention, an outer member (e.g., a sea member) can be formed of the polymeric material A and can surround a set of inner members (e.g., island members) formed from the set of separate blends.

With reference to FIG. 6, the aspirator 136 delivers attenuated multi-component fibers 140 onto a web-forming screen belt 142, which is supported and driven by rolls 144, 146, and 150. A suction box 148 can be connected to a fan (not shown in FIG. 6) to pull ambient air through the screen belt 142 to cause the attenuated multi-component fibers 140 to form a non-woven web on the screen belt 142. The resulting non-woven web can then be further processed to form textiles, apparel, or other products that are endowed with thermal regulating properties.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

About five pounds of a low molecular weight polyethylene homopolymer (AC-16 polyethylene, drop point 102° C., manufactured by Honeywell Specialty Chemical) was added to a wet flushing apparatus, and the homopolymer was slowly melted and mixed at about 110° to about 130° C. Once the homopolymer was melted, about eight pounds of a wet cake was slowly added to the molten homopolymer over about a 30 minute time period to form a first blend. The wet cake comprised water-wetted microcapsules containing a phase change material (micro PCM lot #M 45-22, 63.2 percent by weight of microcapsules and phase change material, manufactured by Microtek Laboratories, Inc.).

Water was flashed off as the microcapsules containing the phase change material was added to and dispersed in the molten homopolymer. Mixing continued until less than about 0.15 percent by weight of the water remained (as measured using Karl-Fischer titration). The resulting first blend was then cooled and chopped to form a chopped material for further processing.

A dry blend was then formed by dry blending about thirty pounds of the chopped material with about seventy pounds of a fiber-grade polypropylene thermoplastic polymer (Polypropylene homopolymer 6852, manufactured by BP Amoco Polymers).

The resulting dry blend was then extruded using a 2½ inch single screw extruder with all zones set at about 230° C., with a screw speed of about 70 rpm, with 150 mesh filter screens, and with a nitrogen purge. In this manner, pellets were formed. The pellets were then dried overnight in a desiccant bed polymer pellet drying system at 105° C. and at −40° C. dewpoint. These pellets provided 23.1 J/g of thermal energy storage capacity (i.e., latent heat) as measured by Differential Scanning Calorimeter ("DSC") measurements.

Multi-component fibers (here, bi-component fibers) were then melt spun using a bi-component fiber spin pack at temperatures between 230° and 245° C. Spin packs of this general type are described in the patent of Hills, U.S. Pat. No. 5,162,074, entitled "Method of Making Plural Component Fibers." The pellets were used to form core members, and polypropylene or nylon was used to form sheath members.

Multi-component fibers formed with various core/sheath ratios and polymeric materials were produced. With reference to FIG. 7, a number of properties and manufacturing parameters of six core/sheath fibers that were produced are set forth. These fibers all incorporate a phase change material and microcapsules that contain the phase change material ("mPCM"), which make up about 15 percent by weight of each fiber's core member and from about 7.5 percent to about 11.25 percent by weight of each fiber's total weight. Samples 1, 2 and 3 have a sheath member including polypropylene ("PP"), which is a polypropylene homopolymer from BP Amoco Polymers. Samples 4, 5 and 6 have a sheath member including Nylon 6, which is produced under the name Ultramid B from BASF Corp.

Example 2

Various polyethylene-co-vinyl acetate ("EVA") pellets were imbibed with K19 paraffin wax (melt point 29° C., 150 J/g latent heat, manufactured by American Refining Group, Bradford, Pa.) by soaking and heating to swell the pellets. In particular, Elvax 350 (19 melt index, 25 percent by weight of vinyl acetate, manufactured by DuPont Inc.) and Elvax 450 (8 melt index, 18 percent by weight of vinyl acetate, manufactured by DuPont Inc.) pellets were heated for various times and temperatures. The pellets were filtered away from the remainder of the paraffin wax in a drain tank, and the amount of paraffin wax imbibed into the pellets was calculated from initial and final pellet weights (i.e., as percent weight increase relative to initial pellet weights). Table 4 sets forth the results obtained under various conditions.

TABLE 4

| EVA Type | Imbibe Time (hr) | Imbibe Temp. (° C.) | % wax imbibed | Comments |
| --- | --- | --- | --- | --- |
| Elvax 450 | 1.0 | 50 | 16 | Sticky in drain tank. Drained more the next day. |
| Elvax 450 | 1.0 | 40 | 16 | Sticky in drain tank. Drained more the next day. |
| Elvax 450 | 1.0 | 80 | | Melted |
| Elvax 450 | 1.0 | 55 | 16 | Sticky in drain tank. Drained more the next day. |
| Elvax 450 | 3.0 | 55 | 32 | Sticky in drain tank. Drained more the next day. |
| Elvax 450 | 2.0 | 55 | 26 | Sticky in drain tank. Drained more the next day. |
| Elvax 450 | 1.0 | 60 | 43 | Sticky in drain tank. Drained more the next day. |
| Elvax 450 | 2.0 | 60 | 43 | Sticky in drain tank. Drained more the next day. |
| Elvax 450 | 5.0 | 60 | 44 | Sticky in drain tank. Drained more the next day. |
| Elvax 450 | 3.0 | 60 | 39 | Sticky in drain tank. Drained more the next day. |
| Elvax 350 | 2.0 | 40 | 31 | Dry in the drain tank. Stayed dry. Stuck lightly |
| Elvax 350 | 3.5 | 40 | 38 | Dry in the drain tank. Stayed dry. Stuck lightly |
| Elvax 350 | 2.5 | 45 | 48 | Dry in the drain tank. Stayed dry. Stuck lightly |
| Elvax 350 | 2.0 | 40 | 20 | Dry in the drain tank. Stayed dry. Stuck lightly |
| Elvax 350 | 2.0 | 40 | 20 | Dry in the drain tank. Stayed dry. Stuck lightly |

Core/sheath fibers were then produced with a standard Hills, Inc. bi-component fiber spin pack using some of the pellets described above to form core members. In particular, core members were formed using either 26 percent wax imbibed Elvax 450 pellets or 31 percent wax imbibed Elvax 350 pellets. Sheath members were formed using either polyethylene terephthalate (Eastman F61HC, manufactured by Eastman Chemical, Inc., Kingsport, Tenn.) ("PET") or polytrimethylene terephthalate (Corterra 509210, manufactured by Shell Chemical Corp., Houston, Tex.) ("PTT").

DSC measurements of the core/sheath fibers were made using a Perkin Elmer Pyris 1 instrument. Cooling was accomplished using a FTS Systems Intercooler 1, and data analysis was performed using a Perkin Elmer Pyris Thermal Analysis System and Software for Windows, version 3.72. Test samples were prepared in Perkin Elmer hermetically sealed aluminum sample pans, and testing was performed while the test samples were continuously subjected to $N_2$ flow.

Test conditions included: 1) cooling the test samples to about −10° C.; 2) isothermal hold for about 1 minute at −10° C.; 3) heating from −10° C. to about 50° C. at a rate of about 5° C. per minute; 4) isothermal hold for about 1 minute at 50° C.; and then 5) cooling from 50° C. to about −10° C. at a rate of about 5° C. per minute. Results were calculated using automatic machine integration of the measured crystallization exotherm peak of the paraffin wax. Table 5 sets forth various properties of the core/sheath fibers.

TABLE 5

| Sheath Member | Core Member | Latent Heat (J/g) | Denier/ filament | Tenacity (g/d) | Elongation (%) |
| --- | --- | --- | --- | --- | --- |
| PTT | 26% wax imbibed Elvax 450 | 12.3 | 4.4 | 2.2 | 35 |
| PET | 31% wax imbibed Elvax 350 | 6.9 | 3.7 | 2.8 | 30 |
| PET | 31% wax imbibed Elvax 350 | 8.4 | 34.5 | 1.43 | 57 |

Example 3

Core/sheath fibers were formed using polypropylene. These core/sheath fibers incorporated a phase change material to provide a latent heat of 12 J/g, and were woven into a 100 percent fleece product ("PP Outlast") with a latent heat of 12 J/g. Table 6 sets forth various properties of the PP Outlast as compared with a control fleece product ("PP Control"), which was formed from polypropylene fibers lacking a phase change material.

Figure 8:
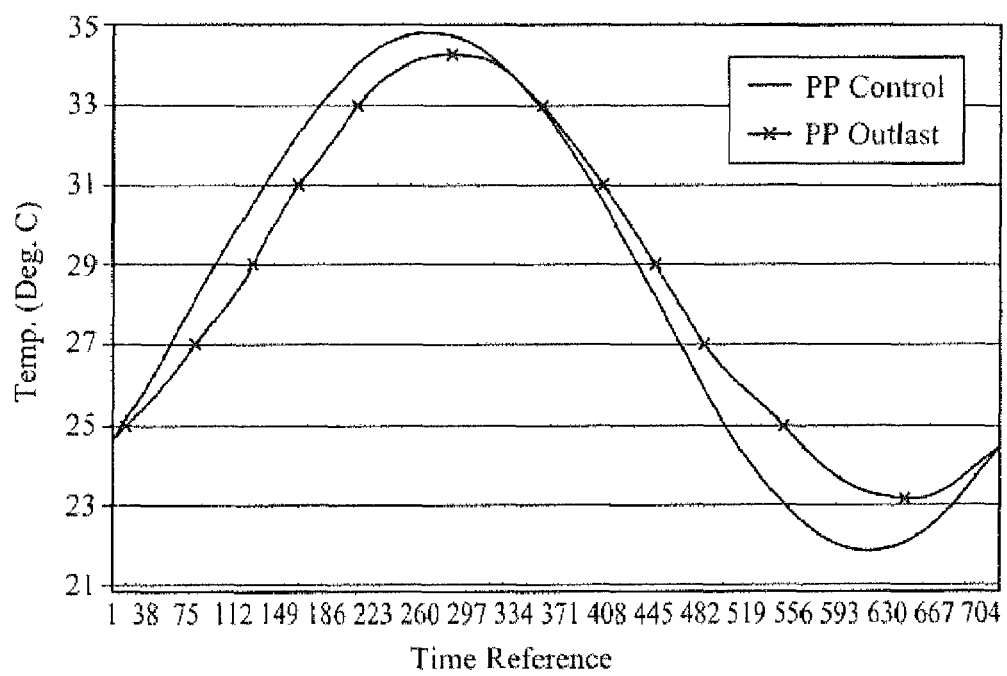
FIG. 8 illustrates results of dynamic temperature measurements for a fleece product ("PP Outlast"), which includes a phase change material, and a control fleece product ("PP Control") according to an embodiment of the invention.

Dynamic thermal measurements of the PP Outlast and the PP Control were made as described in the patent of Hittle et al., U.S. Pat. No. 6,408,256, entitled "Apparatus and Method for Thermal Evaluation of any Thin Material," and American Society for Testing and Materials ("ASTM") D7024-04-Standard Test Method for Steady State and Dynamic Thermal Performance of Textile Materials, the disclosures of which are incorporated herein by reference in their entirety. Table 6 sets forth various measurement settings and results, including a thermal resistance value ("R value") and a difference between a maximum temperature value and a minimum temperature value ("Temperature Amplitude"). With reference to FIG. 8, temperature values associated with the PP Outlast and the PP Control are shown as a function of time. As can be appreciated by referring to Table 6 and FIG. 8, the PP Outlast exhibited a reduced Temperature Amplitude of 1.8° C. as compared with the PP Control.

TABLE 6

| | Fabric Properties | | Measurement Settings | | | Results | | |
| --- | --- | --- | --- | --- | --- | --- | --- | --- |
| | | | | | | | Temperature | |
| Sample | Latent Heat (J/g) | Fabric weight (g/m²) | Added Loft | Flux (W/m²) | Cycle Time | R value | Amplitude (° C.) | ΔT (° C.) |
| PP Outlast | 12.0 | 298 | 100 g | 100 ± 50 | 726 | 0.17 | 11.2 | 1.8 |
| PP Control | 0 | 239 | 100 g | 100 ± 50 | 726 | 0.16 | 13.0 | |

Example 4

Core/sheath staple fibers were formed using polyethylene terephthalate. These core/sheath fibers incorporated a phase change material to provide a latent heat of 7.1 J/g, and were blended 80/20 with a fiber formed using a low melting binder, lofted, and heated to form a lofted nonwoven insulation product ("Polyester Nonwoven") with a latent heat of 5.7 J/g. Table 7 sets forth various properties of the Polyester Nonwoven as compared with a control product ("Control"), which was formed from fibers lacking a phase change material.

Figure 9:
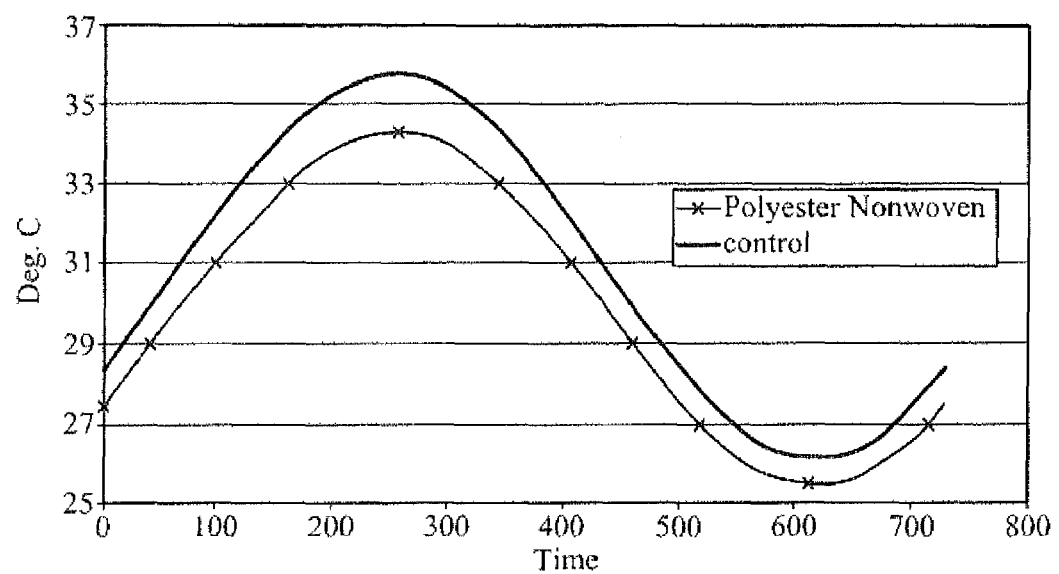
FIG. 9 illustrates results of dynamic temperature measurements for a lofted nonwoven insulation product ("Polyester Nonwoven"), which includes a phase change material, and a control product ("Control"), according to an embodiment of the invention.

Dynamic thermal measurements of the Polyester Nonwoven and the Control were made as described in Example 3. Table 7 sets forth various measurement settings and results, including a thermal resistance value ("R value") and a difference between a maximum temperature value and a minimum temperature value ("Temperature Amplitude"). With reference to FIG. 9, temperature values associated with the Polyester Nonwoven and the Control are shown as a function of time. As can be appreciated by referring to Table 7 and FIG. 9, the Polyester Nonwoven exhibited a reduced Temperature Amplitude of 0.87° C. as compared with the Control.

TABLE 7

| | Fabric Properties | | Measurement Settings | | | Results | | |
| --- | --- | --- | --- | --- | --- | --- | --- | --- |
| | | | | | | | Temperature | |
| Sample | Latent Heat (J/g) | Fabric weight (g/m²) | Added Loft | Flux (W/m²) | Cycle Time | R value | Amplitude (° C.) | ΔT (° C.) |
| Polyester Nonwoven | 5.7 | 294 | 0 | 50 ± 25 | 726 | 0.22 | 8.80 | 0.87 |
| Control | 0 | 310 | 0 | 50 ± 25 | 726 | 0.24 | 9.67 | |

Example 5

Core/sheath staple fibers were formed using polyethylene terephthalate. These core/sheath fibers incorporated a phase change material to provide a latent heat of 8.9 J/g, and were carded and needle punched to form a needle punched nonwoven insulation product ("Needlepunch NW") with a latent heat of 8.9 J/g. Table 8 sets forth various properties of the Needlepunch NW as compared with a control product ("Control"), which was formed from fibers lacking a phase change material.

Figure 10:
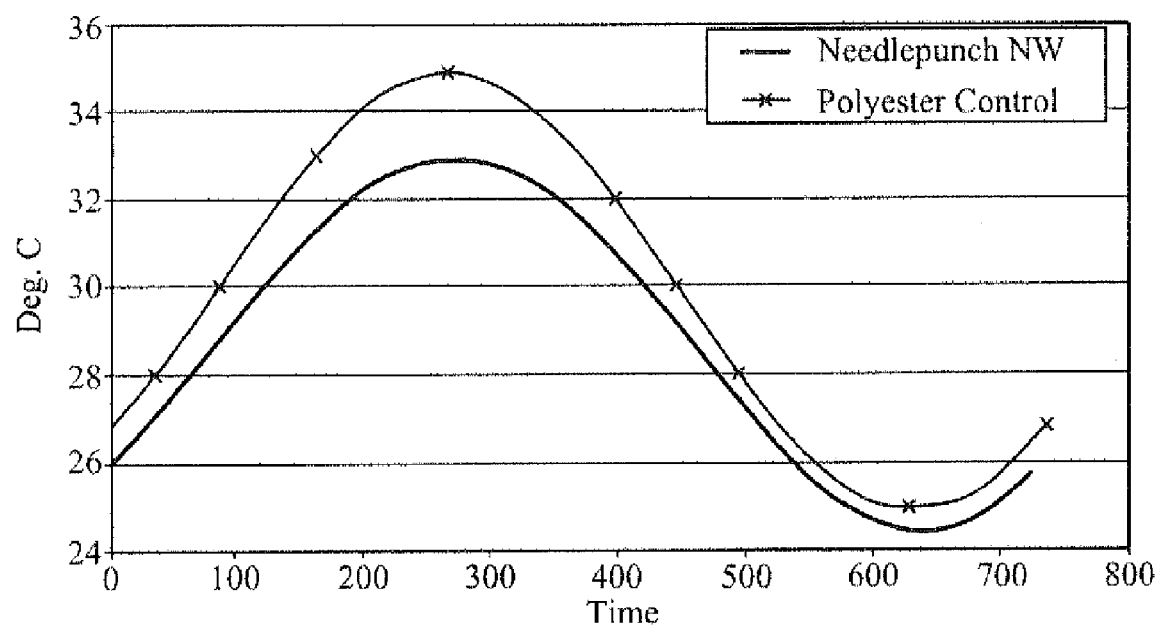
FIG. 10 illustrates results of dynamic temperature measurements for a needle punched nonwoven insulation product ("Needlepunch NW"), which includes a phase change material, and a control product ("Polyester Control"), according to an embodiment of the invention.

Dynamic thermal measurements of the Needlepunch NW and the Control were made as described in Example 3. Table 8 sets forth various measurement settings and results, including a thermal resistance value ("R value") and a difference between a maximum temperature value and a minimum temperature value ("Temperature Amplitude"). With reference to FIG. 10, temperature values associated with the Needlepunch NW and the Control are shown as a function of time. As can be appreciated by referring to Table 8 and FIG. 10, the Needlepunch NW exhibited a reduced Temperature Amplitude of 1.40° C. as compared with the Control.

TABLE 8

| | Fabric Properties | | | Measurement Settings | | | Results | |
| | | | | | | | Temperature | |
| Sample | Latent Heat (J/g) | Fabric weight. (g/m²) | Added Loft | Flux (W/m²) | Cycle Time | R value | Amplitude (° C.) | ΔT (° C.) |
| --- | --- | --- | --- | --- | --- | --- | --- | --- |
| Needle punch NW | 8.9 | 170 | 120 | 50 ± 25 | 726 | 0.24 | 8.60 | 1.40 |
| Control | 0 | 150 | 120 | 50 ± 25 | 726 | 0.26 | 10.00 | |

Example 6

Core/sheath fibers were formed using polyethylene terephthalate. These core/sheath fibers incorporated a phase change material, and were used to form a yarn (160 denier/72 filament) with a latent heat of 2.3 J/g. The yarn was then single-end knitted to form a fabric ("PET knit") with a latent heat of 2.3 J/g. Core/sheath fibers were also formed using polytrimethylene terephthalate. These core/sheath fibers incorporated a phase change material, and were used to form a yarn (150 denier/36 filament) with a latent heat of 10.1 J/g. The yarn was then single-end knitted to form a fabric ("PTT knit") with a latent heat of 10. 1 J/g. Table 9 sets forth various properties of the PET knit and the PTT knit as compared with a control product ("PET Control"), which was formed from a polyethylene terephthalate filament yarn (60 denier/50 filament) lacking a phase change material.

Figure 11:
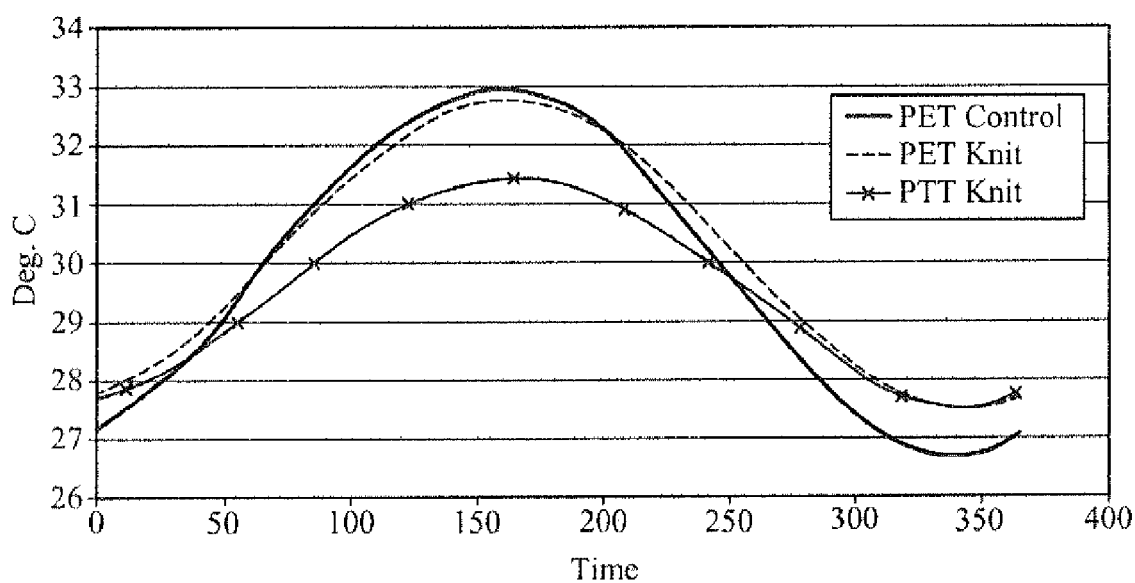
FIG. 11 illustrates results of dynamic temperature measurements for two fabrics ("PET knit" and "PTT knit"), which include phase change materials, and a control product ("PET Control"), according to an embodiment of the invention.

Dynamic thermal measurements of the PET knit, PTT knit, and the PET Control were made as described in Example 3. Table 9 sets forth various measurement settings and results, including a thermal resistance value ("R value") and a difference between a maximum temperature value and a minimum temperature value ("Temperature Amplitude"). With reference to FIG. 11, temperature values associated with the PET knit, the PTT knit, and the PET Control are shown as a function of time. As can be appreciated by referring to Table 9 and FIG. 11, the PET knit exhibited a reduced Temperature Amplitude of 1.00° C. as compared with the PET Control, and the PTT knit exhibited a reduced Temperature Amplitude of 2.40° C. as compared with the PET Control.

Example 7

Core/sheath fibers were formed using polybutylene terephthalate. One set of the core/sheath fibers incorporated a phase change material, and were used to form a yarn with a latent heat of 12.9 J/g. The yarn was then single-end knitted to form a fabric ("#2 PBT knit") with a latent heat of 12.9 J/g. Another set of the core/sheath fibers also incorporated a phase change material, and were used to form a yarn with a latent heat of 19.9 J/g. The yarn was then single-end knitted to form a fabric ("#3 PBT knit") with a latent heat of 19.9 J/g. Table 10 sets forth various properties of the #2 PBT knit and the #3 PBT knit as compared with a control product ("PET Control"), which was formed from a polyethylene terephthalate yarn lacking a phase change material.

Figure 12:
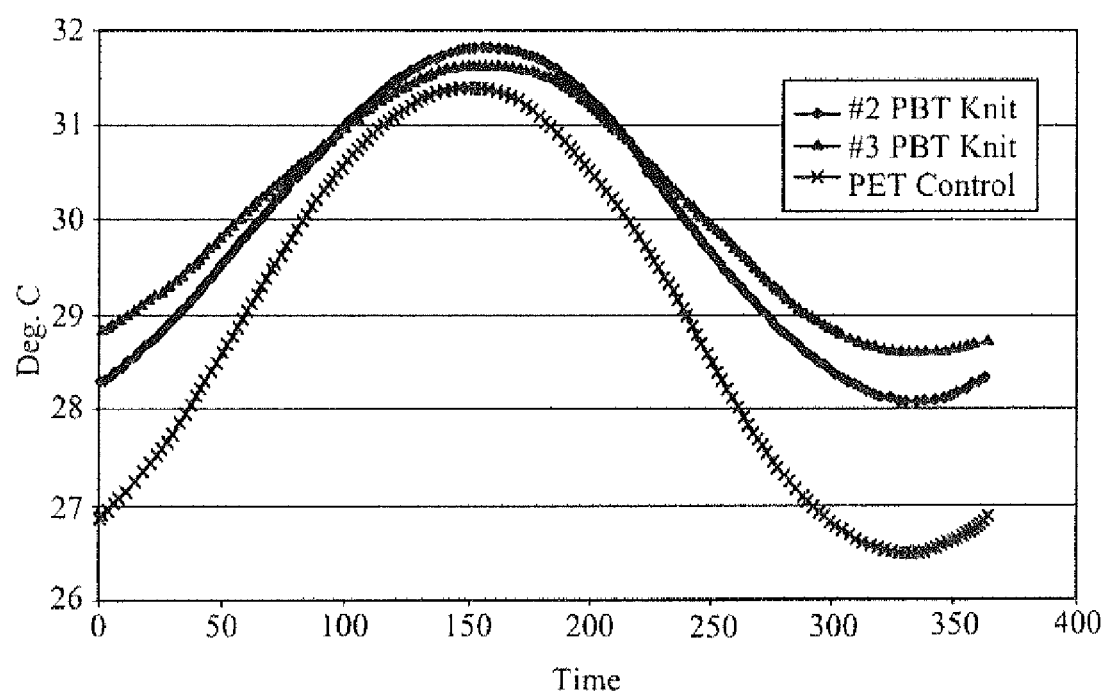
FIG. 12 illustrates results of dynamic temperature measurements for two fabrics ("#2 PBT knit" and "#3 PBT knit"), which include phase change materials, and a control product ("PET Control"), according to an embodiment of the invention.

Dynamic thermal measurements of the #2 PBT knit, #3 PBT knit, and the PET Control were made as described in Example 3. Table 10 sets forth various measurement settings and results, including a thermal resistance value ("R value") and a difference between a maximum temperature value and a minimum temperature value ("Temperature Amplitude"). With reference to FIG. 12, temperature values associated with the #2 PBT knit, the #3 PBT knit, and the PET Control are shown as a function of time. As can be appreciated by referring to Table 10 and FIG. 12, the #2 PBT knit exhibited a reduced Temperature Amplitude of 1.1° C. as compared with the PET Control, and the #3 PET knit exhibited a reduced Temperature Amplitude of 1.8° C. as compared with the PET Control.

TABLE 9

| | Fabric Properties | | | Measurement Settings | | | Results | |
| | | | | | | | Temperature | |
| Sample | Latent Heat (J/g) | Fabric weight (g/m²) | Added Loft | Flux (W/m²) | Cycle Time | R value | Amplitude (° C.) | ΔT (° C.) |
| --- | --- | --- | --- | --- | --- | --- | --- | --- |
| PET knit | 2.3 | N/A | 210 | 50 ± 25 | 363 | 0.24 | 5.32 | 1.00 |
| PTT knit | 10.1 | N/A | 210 | 50 ± 25 | 363 | 0.26 | 3.92 | 2.40 |
| PET Control | 0 | N/A | 210 | 50 ± 25 | 363 | 0.24 | 6.32 | |

TABLE 10

| | Fabric Properties | | Measurement Settings | | | | Results | |
| | | | | | | | Temperature | |
| Sample | Latent Heat (J/g) | Fabric weight (g/m²) | Added Loft | Flux (W/m²) | Cycle Time | R value | Amplitude (° C.) | ΔT (° C.) |
|---|---|---|---|---|---|---|---|---|
| #2 PBT knit | 12.9 | 288 | 200 | 50 ± 25 | 363 | 0.20 | 3.8 | 1.1 |
| #3 PBT knit | 19.9 | 408 | 200 | 50 ± 25 | 363 | 0.22 | 3.1 | 1.8 |
| PET Control | 0 | 338 | 200 | 50 ± 25 | 363 | 0.18 | 4.9 | |

A practitioner of ordinary skill in the art requires no additional explanation in developing the multi-component fibers described herein but may nevertheless find some helpful guidance by examining the patents of Hartmann, entitled "Stable Phase Change Materials for Use in Temperature Regulating Synthetic Fibers, Fabrics And Textiles," U.S. Pat. No. 6,689,466, issued on Feb. 10, 2004, and of Hartmann et al., entitled "Melt Spinnable Concentrate Pellets Having Enhanced Reversible Thermal Properties," U.S. Pat. No. 6,793,856, issued on Sep. 21, 2004, the disclosures of which are incorporated herein by reference in their entirety.

Each of the patent applications, patents, publications, and other published documents mentioned or referred to in this specification is herein incorporated by reference in its entirety, to the same extent as if each individual patent application, patent, publication, and other published document was specifically and individually indicated to be incorporated by reference.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the invention. All such modifications are intended to be within the scope of the claims appended hereto. In particular, while the methods disclosed herein have been described with reference to particular steps performed in a particular order, it will be understood that these steps may be combined, sub-divided, or re-ordered to form an equivalent method without departing from the teachings of the invention. Accordingly, unless specifically indicated herein, the order and grouping of the steps is not a limitation of the invention.

What is claimed is:

1. A multi-component fiber, comprising:
a fiber body formed from a plurality of elongated members, at least one of the plurality of elongated members comprising a temperature regulating material having a latent heat of at least 40 J/g and a transition temperature in the range of 22° C. to 40° C.,
wherein the temperature regulating material has a partial affinity or partial compatibility with the at least one of the plurality of elongate members,
wherein the temperature regulating material forms at least one discrete domain within the at least one of the plurality of elongated members,
wherein the plurality of elongated members are arranged in one of an island-in-sea configuration, a segmented-pie configuration, a core-sheath configuration, a side-by-side configuration, and a striped configuration.

2. A multi-component fiber, comprising:
a core member, the core member comprising
a first phase change material having a latent heat of at least 40 J/g and a transition temperature in the range of 10° C. to 50° C., the first phase change material having a partial affinity or partial compatibility with the core member, wherein the first phase change material forms at least one discrete domain within the core member;
a second phase change material; and
a sheath member surrounding the core member and forming an exterior of the multi-component fiber.

3. The multi-component fiber of claim 2, wherein the latent heat of the first phase change material is at least 50 J/g.

4. The multi-component fiber of claim 2, wherein the latent heat of the first phase change material is at least 60 J/g.

5. The multi-component fiber of claim 2, wherein the transition temperature of the first phase change material is in the range of 22° C. to 40° C.

6. The multi-component fiber of claim 2, wherein the first phase change material provides thermal regulation based on at least one of melting and crystallization of the phase change material at the transition temperature.

7. The multi-component fiber of claim 2, wherein the core member is concentrically positioned within the sheath member.

8. The multi-component fiber of claim 2, wherein the core member is eccentrically positioned within the sheath member.

9. The multi-component fiber of claim 2, wherein the core member comprises from 10 percent to 30 percent by weight of the first phase change material.

10. The multi-component fiber of claim 2, wherein the first phase change material and the second phase change material are different.

11. The multi-component fiber of claim 2, wherein the multi-component fiber has a latent heat of at least 2 J/g.

12. The multi-component fiber of claim 2, wherein the multi-component fiber has a latent heat of at least 5 J/g.

13. The multi-component fiber of claim 2, wherein the multi-component fiber has a latent heat of at least 8 J/g.

14. The multi-component fiber of claim 1, wherein the temperature regulating material is substantially uniformly distributed within the at least one of the plurality of elongated members.

15. The multi-component fiber of claim 1, wherein the temperature regulating material is randomly distributed within the at least one of the plurality of elongated members.

16. The multi-component fiber of claim 1, wherein the temperature regulating material is distributed in a non-uniform manner within the at least one of the plurality of elongated members.

* * * * *